(12) United States Patent
Or-Bach et al.

(10) Patent No.: US 7,463,062 B2
(45) Date of Patent: *Dec. 9, 2008

(54) STRUCTURED INTEGRATED CIRCUIT DEVICE

(75) Inventors: Zvi Or-Bach, San Jose, CA (US); Ze'ev Wurman, Palo Alto, CA (US); Adam Levinthal, Redwood City, CA (US); Laurence Cooke, Los Gatos, CA (US); Stan Mihelcic, Pleasanton, CA (US)

(73) Assignee: eASIC Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/739,538

(22) Filed: Apr. 24, 2007

(65) Prior Publication Data

US 2007/0188188 A1 Aug. 16, 2007

Related U.S. Application Data

(63) Continuation-in-part of application No. 11/356,076, filed on Feb. 17, 2006, which is a continuation-in-part of application No. 11/186,923, filed on Jul. 22, 2005, now Pat. No. 7,157,937, which is a continuation-in-part of application No. 10/899,020, filed on Jul. 27, 2004, now Pat. No. 7,098,691.

(51) Int. Cl.
*H01L 25/00* (2006.01)
*H03K 19/177* (2006.01)

(52) U.S. Cl. .................. 326/41; 326/39; 326/47

(58) Field of Classification Search ............. 326/37, 326/41, 47, 93
See application file for complete search history.

(56) References Cited

U.S. PATENT DOCUMENTS

| | | | |
|---|---|---|---|
| 5,991,908 | A | 11/1999 | Baxter et al. |
| 6,194,912 | B1 | 2/2001 | Or-Bach |
| 6,236,229 | B1 | 5/2001 | Or-Bach |
| 6,242,767 | B1 | 6/2001 | How et al. |
| 6,245,634 | B1 | 6/2001 | Or-Bach |
| 6,331,733 | B1 | 12/2001 | Or-Bach et al. |
| 6,331,790 | B1 | 12/2001 | Or-Bach et al. |
| 6,427,222 | B1 | 7/2002 | Shau |
| 6,580,289 | B2 | 6/2003 | Cox |
| 6,642,744 | B2 | 11/2003 | Or-Bach et al. |
| 6,693,454 | B2 | 2/2004 | Cox |
| 6,798,239 | B2 | 9/2004 | Douglass et al. |
| 6,873,185 | B2 | 3/2005 | Cox |
| 7,157,937 | B2 * | 1/2007 | Apostol et al. ............. 326/41 |
| 2003/0214322 | A1 | 11/2003 | Cox |
| 2003/0234666 | A1 | 12/2003 | Cox |

* cited by examiner

*Primary Examiner*—Anh Q Tran
(74) *Attorney, Agent, or Firm*—Connolly Bove Lodge & Hutz LLP

(57) ABSTRACT

A configurable logic array may include: a multiplicity of logic cells, containing look-up tables; customizable metal and via connection layers overlying the multiplicity of logic cells; a multiplicity of device customizable I/O cells; a multiplicity of configuration customizable RAM blocks; a ROM block with customizable contents; and a microprocessor with customizable I/O for configuring and testing the array, where the customizations may all be done on a single via layer.

1 Claim, 46 Drawing Sheets

FIGURE 11

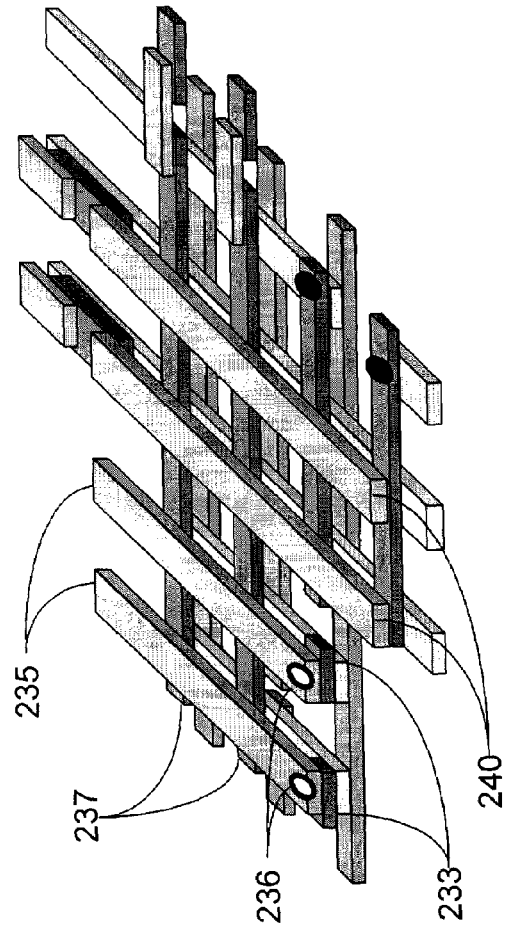
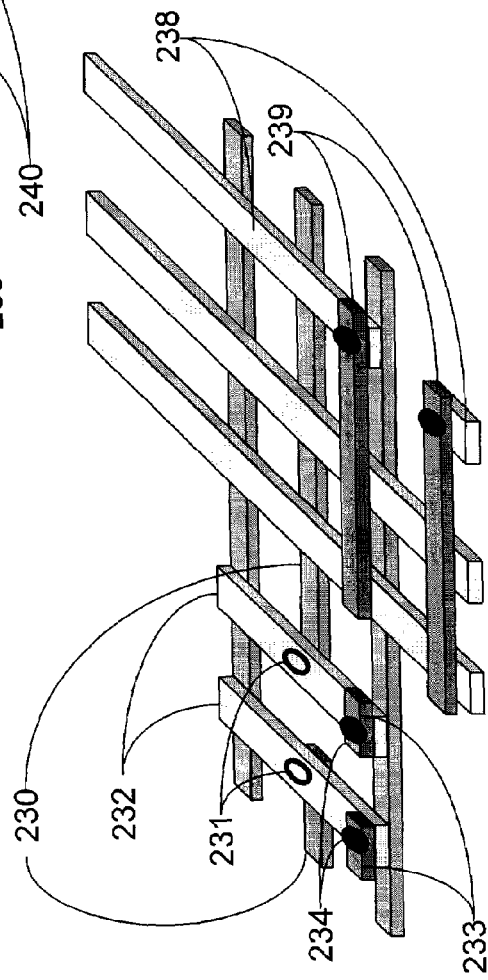
FIGURE 23

STRUCTURED INTEGRATED CIRCUIT DEVICE

CROSS-REFERENCE TO RELATED APPLICATIONS

This application is a continuation-in-part of a U.S. patent application Ser. No. 11/356,076, entitled "Structured Integrated Circuit device", filed on Feb. 17, 2006, which is a continuation-in-part of U.S. patent application Ser. No. 11/186,923, also entitled "Structured Integrated Circuit Device," filed on Jul. 22, 2005, which is a continuation-in-part of U.S. patent application Ser. No. 10/899,020, entitled "Structured Integrated Circuit Device," filed on Jul. 27, 2004, all of which are commonly assigned and incorporated herein by reference.

FIELD OF THE INVENTION

The present invention relates to integrated circuit devices as well as to methods for personalizing, programming and testing such devices.

BACKGROUND OF THE INVENTION

The following U.S. patents are believed to represent the current state of the art: U.S. Pat. Nos. 6,331,733, 6,245,634, 6,236,229, and 6,194,912. These patents all relate to prior art with respect to the current patent.

The above patents describe semiconductor devices, which contain logic cells that further contain look up tables and interconnects, which may be patterned by a single via mask. The advantages of such application-specific integrated circuits (ASICs) have been clearly defined in the prior art, but are limited to logical functions. Today, most semiconductor devices are comprised of random access memory, read only memory and processors, in addition to general combinatorial logic.

It is common to provide such components in a user configurable form within libraries, from which the designer must select and define their specific configuration, prior to instantiating the structure in their design. Typically these structures are implemented out of custom designed transistors and metal interconnects that require a full set of masks to fabricate. This is acceptable for Standard Cell technology, which also requires a full set of masks for the rest of the design, but can pose a problem for Structured ASIC parts, which do not.

On the other hand, field-programmable gate arrays (FPGAs) are devices that are completely programmable at the customer's site. In general RAMs, ROMs and processors, if available on FPGAs, have limited configuration options, which consist of reprogramming the interconnects between appropriate subfunctions. This is costly in both space and performance of the components.

The current invention provides a set of configurable components, many of which may reside together on one semiconductor device, and are configurable by a single via change, the same customization as is done for the rest of the design, resulting in either considerable performance and space advantages over FPGAs or significant reduction in the number of required masks compared with Standard Cell solutions.

It combines the advantages of FPGA technology with those of Standard Cell ASICs by adopting the best features of each approach and avoiding their drawbacks. Thus, on one end, it utilizes the way FPGAs program logic while avoiding their inefficient approach to interconnect routing. On the other end, it utilizes the Standard Cell approach toward interconnect routing while avoiding the expense of its rigid approach to logic definition.

SUMMARY OF THE INVENTION

The present invention seeks to provide an improved integrated circuit, which, in addition to the teachings of the prior art, is personalizable, programmable and testable.

There is thus provided in accordance with a preferred embodiment of the present invention a semiconductor device comprising:

a logic array including a multiplicity of logic cells, each logic cell comprising at least one look-up table, metal and via connection layers overlying the multiplicity of logic cells for providing at least one permanent customized interconnect between various inputs and outputs thereof; wherein the customized interconnect is customized by a custom via layer; and also comprising a multiplicity of device customized I/O cells, wherein the customized I/O cells are customized by the custom via layer.

The number of metal and via connection layers may be determined by the customized interconnect requirements of the designs.

The metal and via connection layers may be further comprised of long and short metal segments, and the long metal segments may be comprised of metal segments connected to jumpers to periodically change tracks.

The logic cell may further include one inverter and one NAND function where the customized interconnect provides for a connection between the NAND function and the inverter.

The logic cell may further include a multiplicity of inverters of different sizes connected to the outputs such that the inverter size of an output may be changed without changing the permanent customized interconnect between logic cells, and the selection of this inverter size may be done after placement and routing.

In addition the logic cell may be permanently customized by vias on the single custom via layer or by vias on another layer. The device may further comprise a configurable RAM block, wherein the RAM block configuration is customized by the custom via layer.

It may also comprise a built-in microprocessor, wherein the microprocessor has the ability to access the RAM block by a separate read/write port from the configurable RAM port, wherein the configurable RAM port also includes via options for wired-OR-logic multiplexing output of multiple RAMs.

It may also comprise a configurable ROM block, wherein the ROM block content is customized by the custom via layer.

It may also comprise a customizable clocks distribution structure, wherein the customizable clocks distribution structure is customized by the custom via layer, and may further comprise a customizable trimmer cell to fine tune the clocks distribution structure, wherein the customizable trimmer cell is customized by the custom via layer.

There is additionally provided in accordance with a preferred embodiment of the present invention, a semiconductor device comprising:

a logic array including a multiplicity of logic cells, each logic cell comprising at least one look-up table, metal connection layers overlying the multiplicity of logic cells for providing at least one permanent customized interconnect between various inputs and outputs thereof;

and a built-in microprocessor, and further comprising a configurable ROM block, wherein the microprocessor has the ability to load or to read the content of the look-up table, and the microprocessor has the ability to perform testing of the logic array, and also comprising a configurable RAM block, wherein the microprocessor has the ability to perform test of the RAM block.

There is additionally provided in accordance with a preferred embodiment of the present invention, a semiconductor device comprising: a logic array comprising a multiplicity of logic cells, each logic cell including at least one flip-flop; and at least one metal connection layer overlying the multiplicity of identical logic cells for providing at least one permanent customized interconnect between various inputs and outputs thereof; wherein the customized interconnect is customized by a custom via layer; and also comprising a multiplicity of device customized I/O cells, wherein the customized I/O cells are customized by the custom via layer, also comprising a configurable RAM block, wherein the RAM block configuration is customized by the custom via layer, also comprising a configurable ROM block, wherein the ROM block content is customized by the custom via layer, also comprising a customizable clocks distribution structure, wherein the customizable clocks distribution structure is customized by the custom via layer, wherein the customizable clocks distribution structure contains constant loading at each stage of the distribution to maintain a pre-characterized delay regardless of the customization by the custom via layer, and also comprising a customizable trimmer cell to fine tune the clocks distribution structure, wherein the customizable trimmer cell is customized by the custom via layer.

There is additionally provided in accordance with a preferred embodiment of the present invention a logic array comprising:

a multiplicity of identical logic cells, each identical logic cell comprising at least one look-up table, metal connection layers overlying the multiplicity of identical logic cells for providing at least one permanent customized direct interconnect between various inputs and outputs thereof, the logic array being designed such that the functionality of the multiplicity of identical logic cells is one of a number of functions determined by the configuration of the look-up tables.

There is additionally provided in accordance with a preferred embodiment of the present invention a semiconductor device comprising:

a multiplicity of functional blocks, in which at least one of the functional blocks is a configurable ROM block, wherein the contents of the ROM block is customized by a custom via layer, and at least one of the functional blocks is a configurable RAM block, wherein the configuration of the RAM block is customized by a custom via layer;

a multiplicity of metal connection layers overlying the multiplicity of blocks, to provide at least one permanent customized interconnect between various inputs and outputs of the multiplicity of blocks, wherein the customized interconnect is customized by the custom via layer; and a multiplicity of device customized I/O cells, wherein the customized I/O cells are customized by the custom via layer, wherein the custom via layer is produced by wafer exposure directly from electronic data of the custom via layer.

There is additionally provided in a preferred embodiment of the present invention a semiconductor device comprising: a logic array including a multiplicity of logic cells and metal and via connection layers overlying the multiplicity of logic cells for providing at least one permanent customized interconnect between various inputs and outputs thereof, wherein said customized interconnect is customized by a custom via layer, and the number of said metal and via connection layers is determined by the customized interconnect requirements of one or more designs, and one or more designs are selected to require a common number of said multiplicity of metal and via connection layers, and the metal and via connection layers further comprising long and short metal segments, said long metal segments further include metal segments connected to jumpers to periodically change tracks, and at least one logic cell further includes at least one inverter and at least one NAND function, said customized interconnection providing a connection between said NAND function and said inverter, and a multiplicity of inverter sizes (drive strengths) are connected to said outputs, wherein said inverter size may be changed without changing said permanent customized interconnect between logic cells, and the inverter size is selected after placement and routing.

There is additionally provided in a preferred embodiment of the present invention a semiconductor device comprising: a logic array including multiplicity of logic cells and metal and via connection layers overlying the multiplicity of logic cells for providing at least one permanent customized interconnect between various inputs and outputs thereof, wherein the logic cells include one or more look up tables, which may be permanently customized by the placement of vias on a single custom via layer, or on a single via layer other than the single custom via layer, and metal and via connection layers further include short metal segments and jumpers in an interleaved pattern such that the jumpers extend over or under one or more short metal segments There is additionally provided in a preferred embodiment of the present invention a semiconductor wafer comprising a multiplicity of reticle images, the reticle images comprising a multiplicity of dies customized by a single customized via layer patterned by an ebeam, and metal interconnect between the die, wherein the dies on the wafer may be tested with a single probe of each of the reticle images, and the reticle images further comprising a multiplicity of different sized dies, and probing the reticle images is done with a single common probe card.

There is additionally provided in a further embodiment of the present invention a semiconductor wafer comprising a multiplicity of reticle images, the reticle images comprising a multiplicity of dies of different sizes containing solder bumps over the I/O of at least one die, where at least one of the multiplicity of dies of different sizes contains unused space and solder bumps over the unused space for uniform filling of the spaces between the solder bumps during package assembly.

BRIEF DESCRIPTION OF THE DRAWINGS

The present invention will be understood and appreciated more fully from the following detailed description, taken in conjunction with the drawings in which:

FIG. 11 is an illustration of an addressing of blocks within a configurable semiconductor device;

FIG. 23 is another example of long segment interconnection;

DETAILED DESCRIPTION OF VARIOUS EMBODIMENTS

Figure 1:
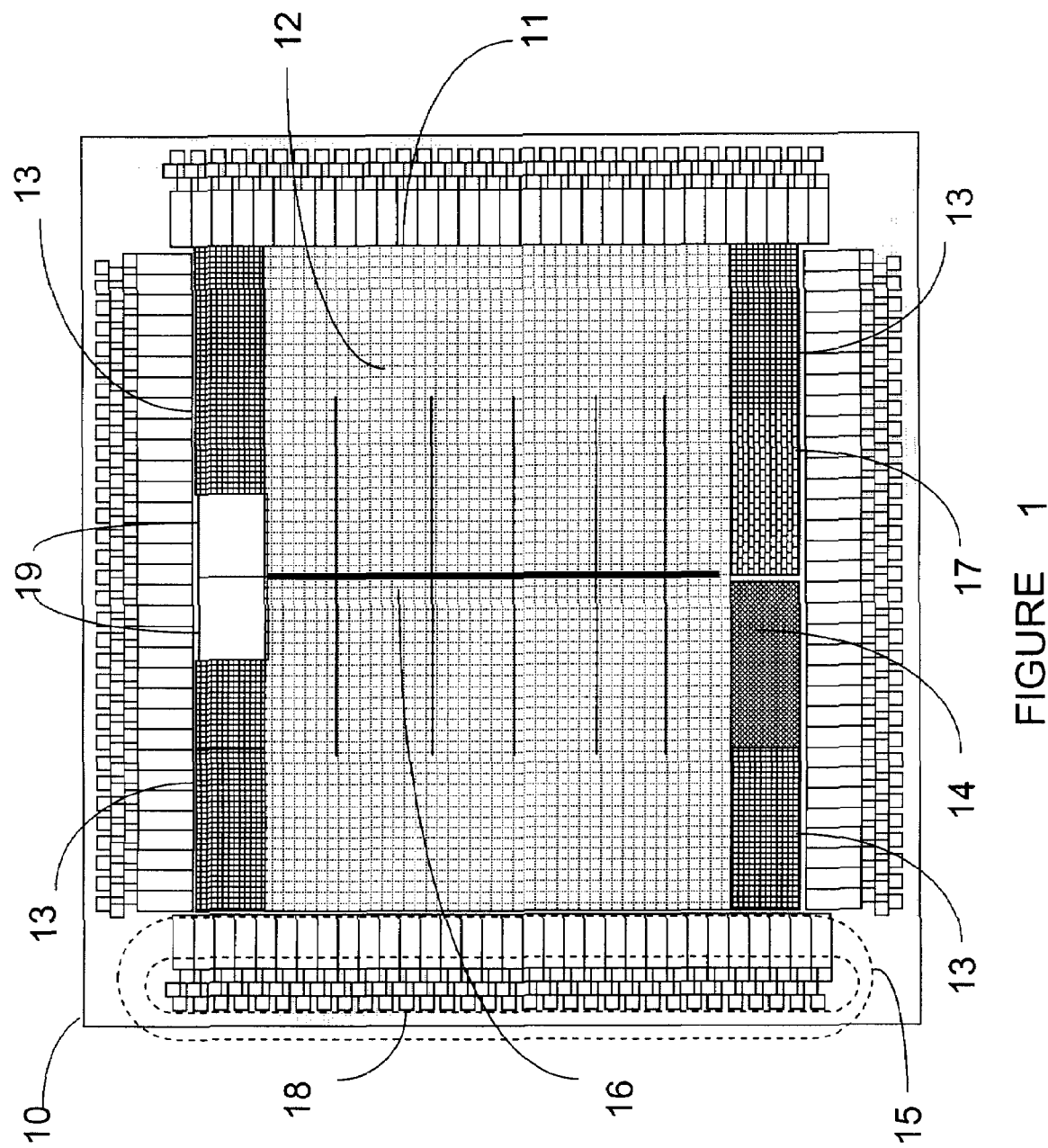
FIG. 1 is a simplified illustration of a semiconductor device containing a multiplicity of logic cells, RAM blocks, ROM blocks, I/O cells, and a clock distribution structure.

Reference is now made to FIG. 1, which is a simplified illustration of a personalizable and programmable integrated circuit device constructed and operative in accordance with a preferred embodiment of the present invention. The integrated circuit device 10 of FIG. 1 consists of a logic array 11 comprised of a multiplicity of logic cells 12 with metal connection layers, a multiplicity of configurable RAM blocks 13, a configurable ROM block 14, clock phase lock loops 19, which drive a configurable clock distribution structure 16, a built-in microprocessor 17 and a multiplicity of configurable I/O cells 15, each with associated I/O pads 18. It is further contemplated that a varying number and size of such devices may reside on many such semiconductor devices.

Figure 2:
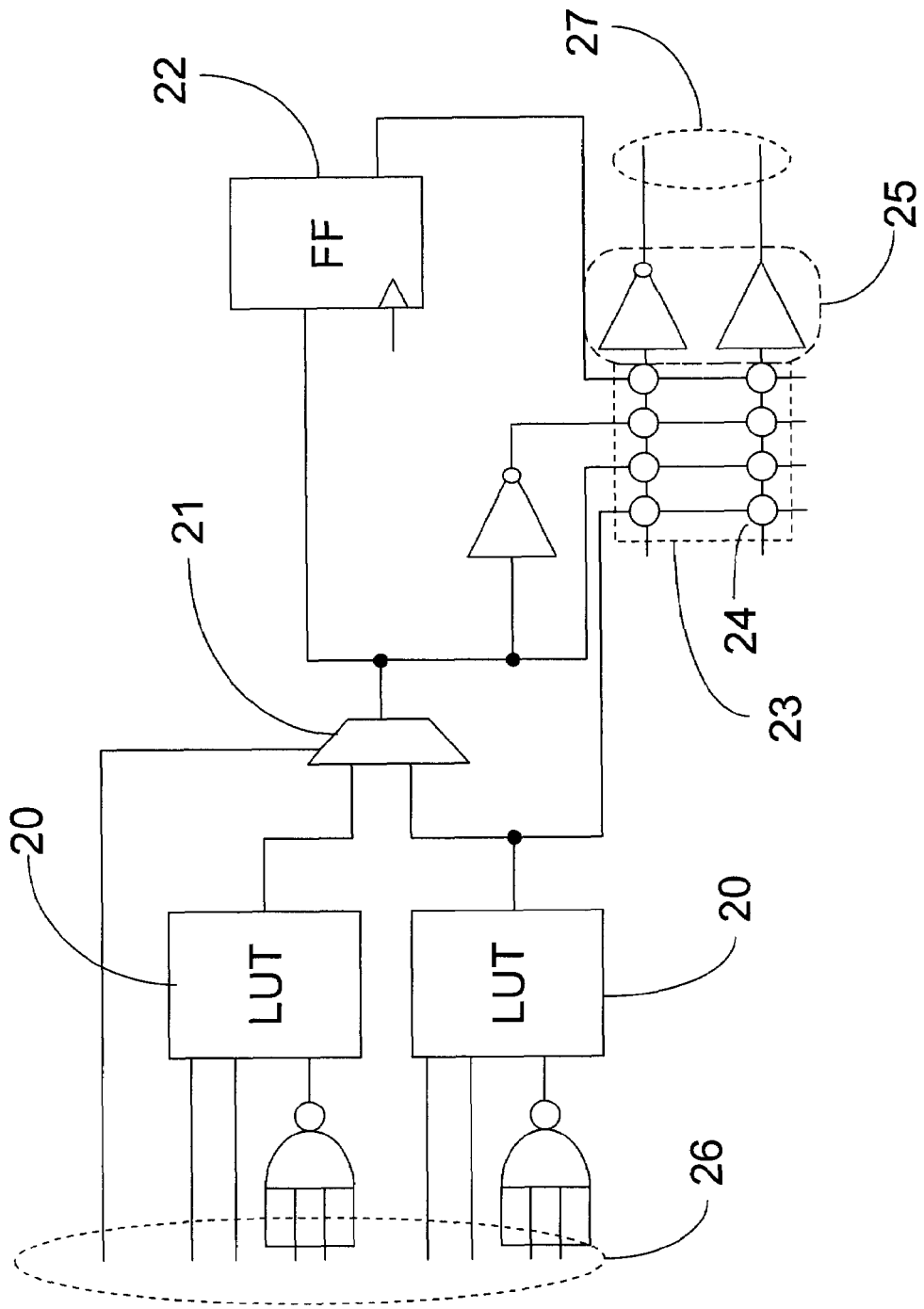
FIG. 2 is a simplified illustration of a logic cell within FIG. 1, including a flip-flop and multiple look up tables in accordance with a preferred embodiment of the present invention.

Reference is now made to FIG. 2, which is a more detailed illustration of a logic cell, as previously described in U.S. Pat. No. 6,642,744 to Or-Bach et al. The logic cells are preferably comprised of two look-up-tables 20, connected through a multiplexer 21 to a flip-flop 22. Preferably there are also a set 23 of positions 24 for selectively placing vias to connect various wires within the logic cell to preferably one of two output buffers 25. Preferably the logic cell inputs 26 and outputs 27 may be connected to the metal layers with a set of vias not shown. It is further contemplated that other combinations of the components shown in FIG. 2 may also be used in logic cells.

Figure 3:
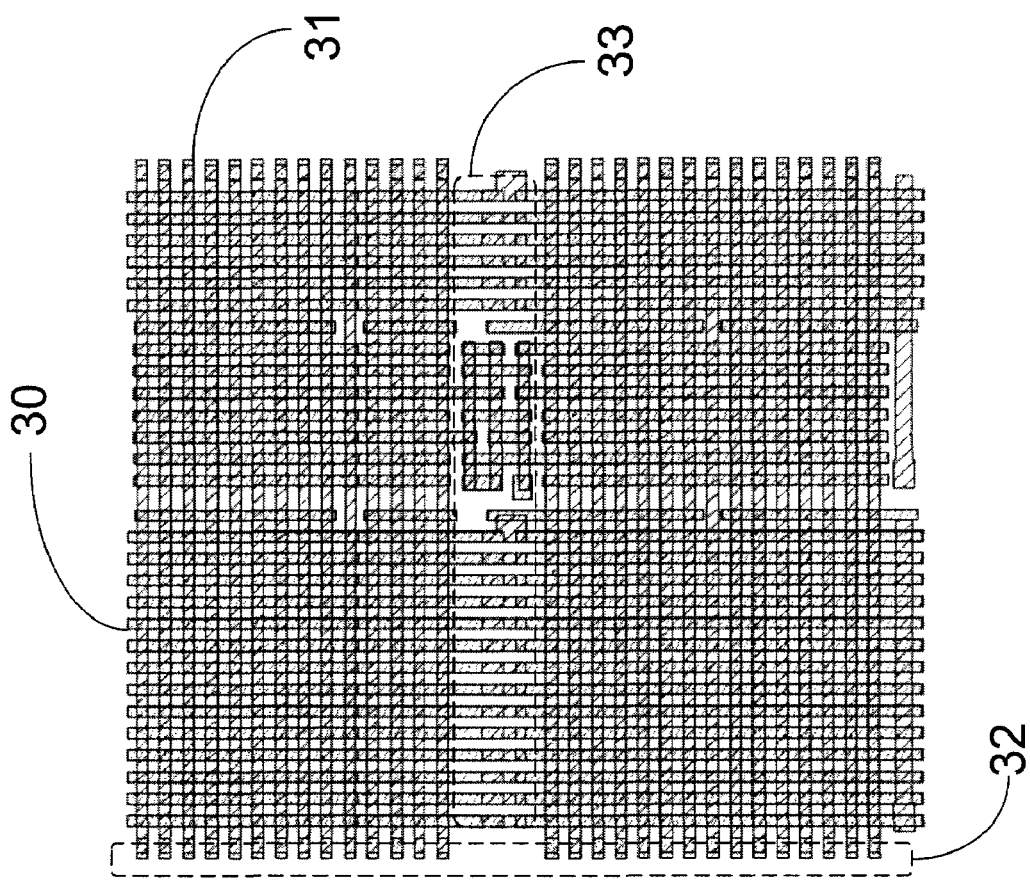
FIG. 3 is an illustration of the wiring layers for providing permanent customizable interconnect between the logic cells illustrated in FIG. 2.

Reference is now made to FIG. 3, which is a detailed illustration of the metal and via configuration layers, again as previously described in U.S. Pat. No. 6,642,744 to Or-Bach, et al. One or more metal layers are preferably in the vertical direction 30, alternating with one or more metal layers that are preferably in the horizontal direction 31. Furthermore, there are locations 32 where selective connection between segments in the horizontal layer may be completed by use of selective placement of vias on the via connection layer up to jumper segments on a vertical layer, and locations 33 where selective connection between vertical segments may be completed by use of selective placement of vias on the via connection layer down to jumper segments on a horizontal layer. Furthermore, it is contemplated that multiple vertical and horizontal layers can be connected by selective placement of vias on a single via connection layer.

Figure 4:
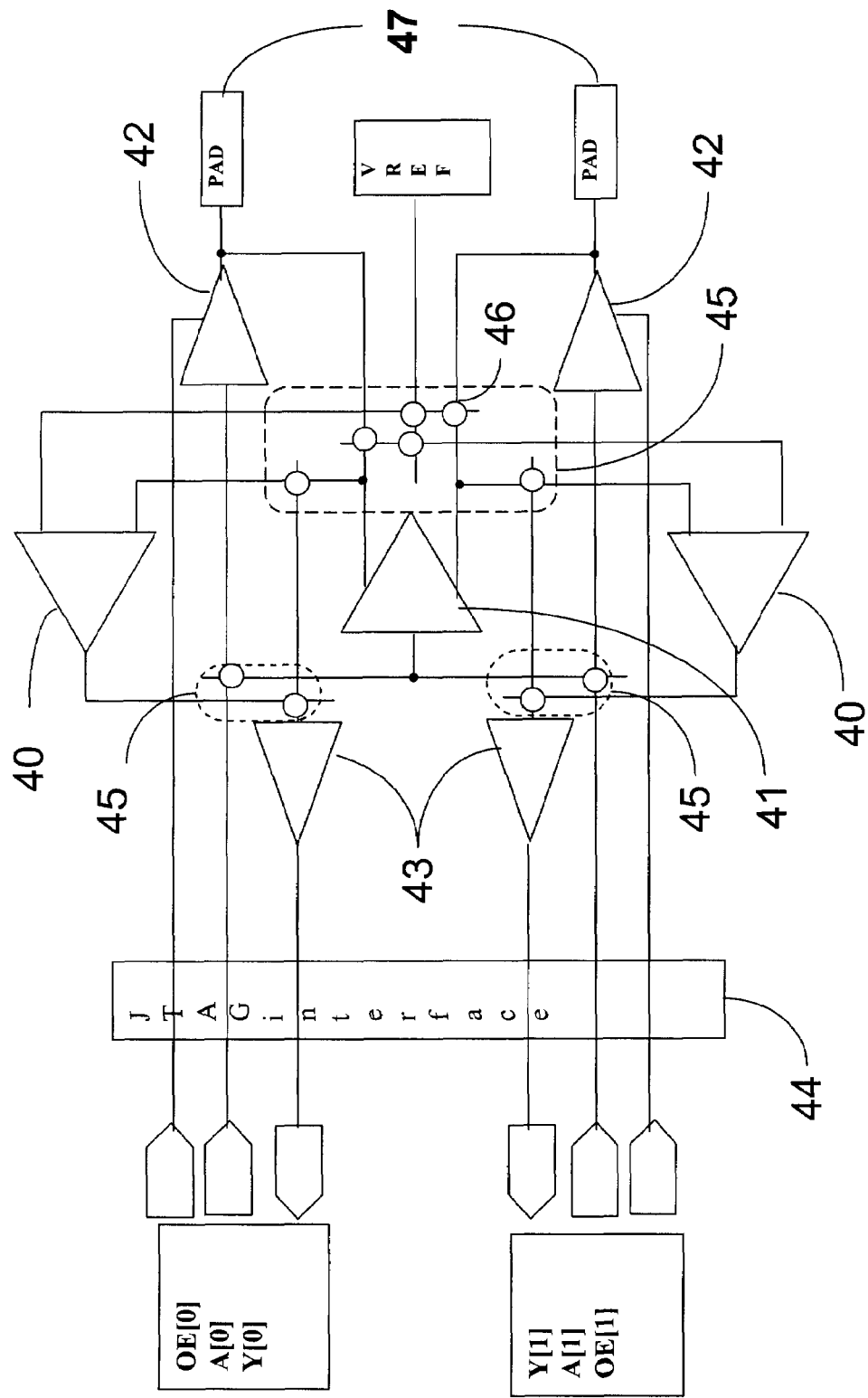
FIG. 4 is an illustration of the circuitry of a single via layer customizable I/O cell.

Reference is now made to FIG. 4, which is a detailed illustration of a single I/O cell, a multiplicity of which are shown in FIG. 1, reference numeral 15. The I/O cells consist of differential receivers 40, an analog driver 41, tristate buffers 42, input buffers 43, and boundary scan JTAG interface 44, configurable into many different types of input, output and bi-directional I/O buffers commonly used in the industry. This configuration is accomplished by connecting a fixed set of metal segments with the selective placement of vias, an example of which is shown in FIG. 4, reference numeral 46, within the designated locations 45 within the I/O cell. Preferably, the via layer to configure the I/O cell is the same via layer used to configure the logic array.

In addition, the input buffers 43 and/or the output buffers 42 may contain registers to respectively capture the input and/or outputted values to improve timing. Furthermore, such registers may be optionally included in the buffers data path by appropriate placement of vias in a manner similar to the example (reference 46 in FIG. 4) above. Furthermore, options to tie the pads 47 to a termination resistor, to ground, to power, or to a weak keeper cell may also be done by similar placement of vias.

Figure 5:
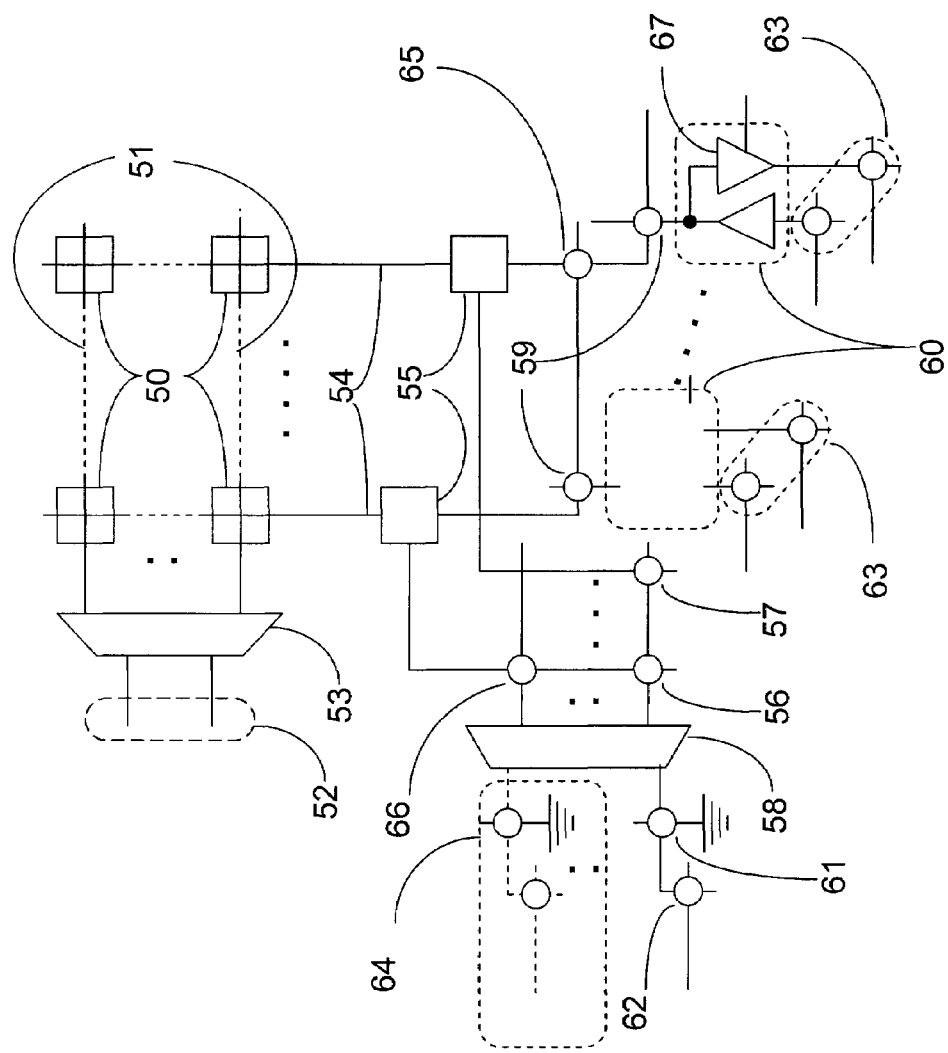
FIG. 5 is an illustration of a customizable RAM block, including single via layer personalization.

Reference is now made to FIG. 5, which is a detailed illustration of a RAM Block, a multiplicity of which are placed on the circuit. Each RAM Block is comprised of a multiplicity of RAM cells 50 in rows and columns. Each row of RAM cells is selected by a word line 51 enabled by an address on a set of address lines 52 decoded by an address decoder 53. The accessed cells transfer data to or receive data from bit lines 54 observed and/or driven by sense amplifier logic 55. Each RAM Block can be configured to read or write a variety of widths of I/O by connecting a set of fixed metal segments via selective placement of vias.

For example, if two bits of output are desired, via locations 56 and 57 are selected to connect both the columns' sense amp logic 55 to address 0 of the column decode 58. The via locations 59 connecting each column's sense amp logic to its respective I/O buffers 60 are also selected. Lastly, the via location 61 grounding the input to the column address logic 58 to select the proper decoded address and the via locations 63 connecting the external logic to both I/O buffers, are selected. On the other hand, if only one I/O buffer is desired, the memory can still be completely used by selecting part of the via locations 63 to connect external signals to only one of the I/O buffers, selecting the via location 62 to connect the external logic to the column address line, selecting via locations 56 and 66 to connect each column's sense amp logic to its own column address line, and selecting a via location 65 to tie together both columns' sense amp logic. In this fashion, both columns are separately addressed to read or write data through the single selected I/O logic. In both cases, the vias are preferably on the via layer used to configure the logic array.

Though the examples only describe selection between two columns of memory cells, a preferred embodiment includes $2^{N+1}$ columns of memory cells, which are optionally addressable by N additional column address lines 64.

Figure 6:
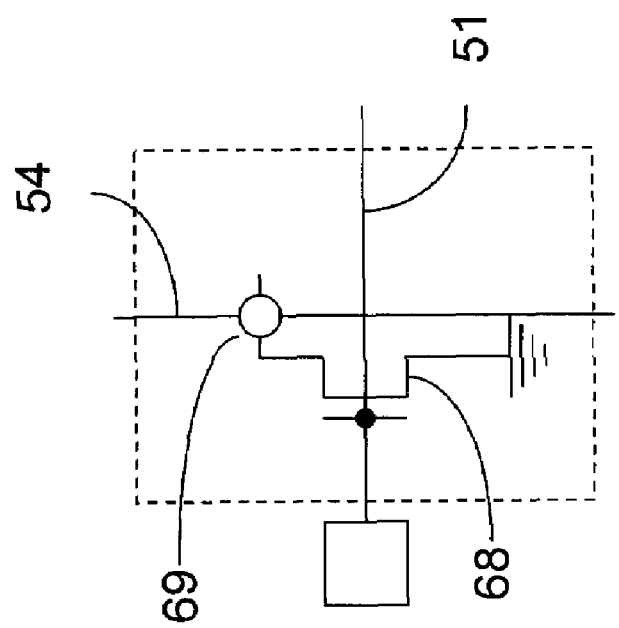
FIG. 6 is an illustration of a bit cell for a ROM block.

In one preferred embodiment, a configurable ROM block can be constructed in a manner similar to the RAM Block illustrated in FIG. 5. In such a preferred embodiment, the bit cells 50 are illustrated in greater detail in FIG. 6. Each ROM bit cell contains a transistor 68 whose source is grounded, gate is tied to its word line 51 and drain is selectively connected to its column's bit line by a via 69, preferably a via on the via layer used to configure the logic array. Furthermore, the sense amp logic 54 need only be a tristate output, not bi-directional, and the I/O logic 60 will only include the output buffer 67, as shown in FIG. 5.

Figure 7:
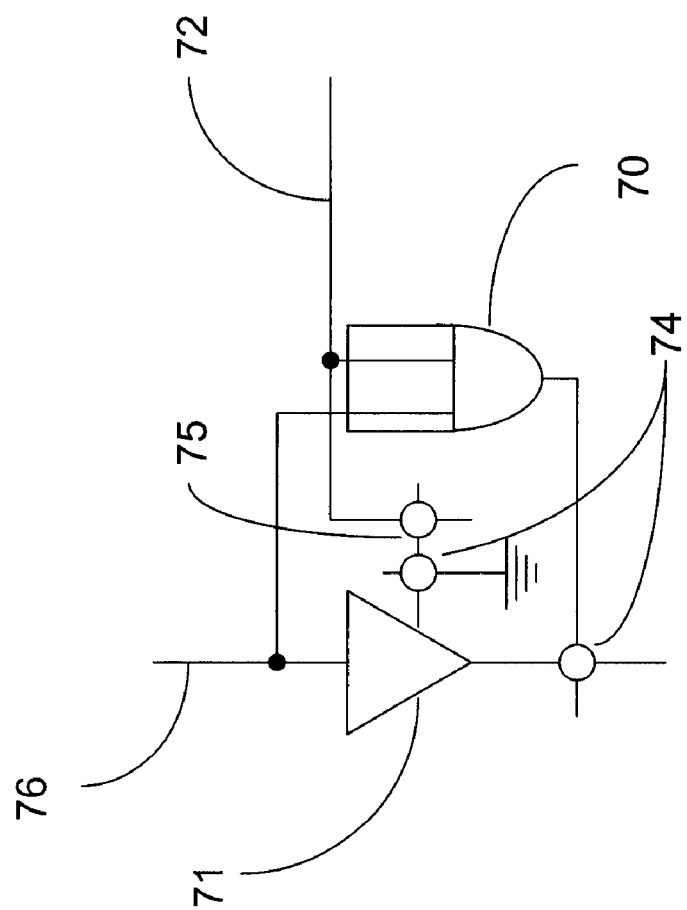
FIG. 7 is an illustration of a configurable output buffer for a ROM or RAM block.

The RAM block or ROM block output buffer 67 shown in FIG. 5, is expanded in FIG. 7. In this preferred embodiment, both an AND gate 70 and a tristate buffer 71 are driven by the data line 76 and the enable line 72. The AND gate can be selected by tying off the tristate buffer 71 and connecting the AND gate to the output. This is accomplished by placing vias in the selected via locations 74. Alternatively the tristate buffer 71 can be selected by connecting the enable line to the tristate enable input by placing a via in the proper location 75 to connect them. This selection allows either multiple outputs to be correspondingly connected together with an OR function, or wired together. In both cases, the vias are preferably on the via layer used to configure the logic array.

Figure 8:
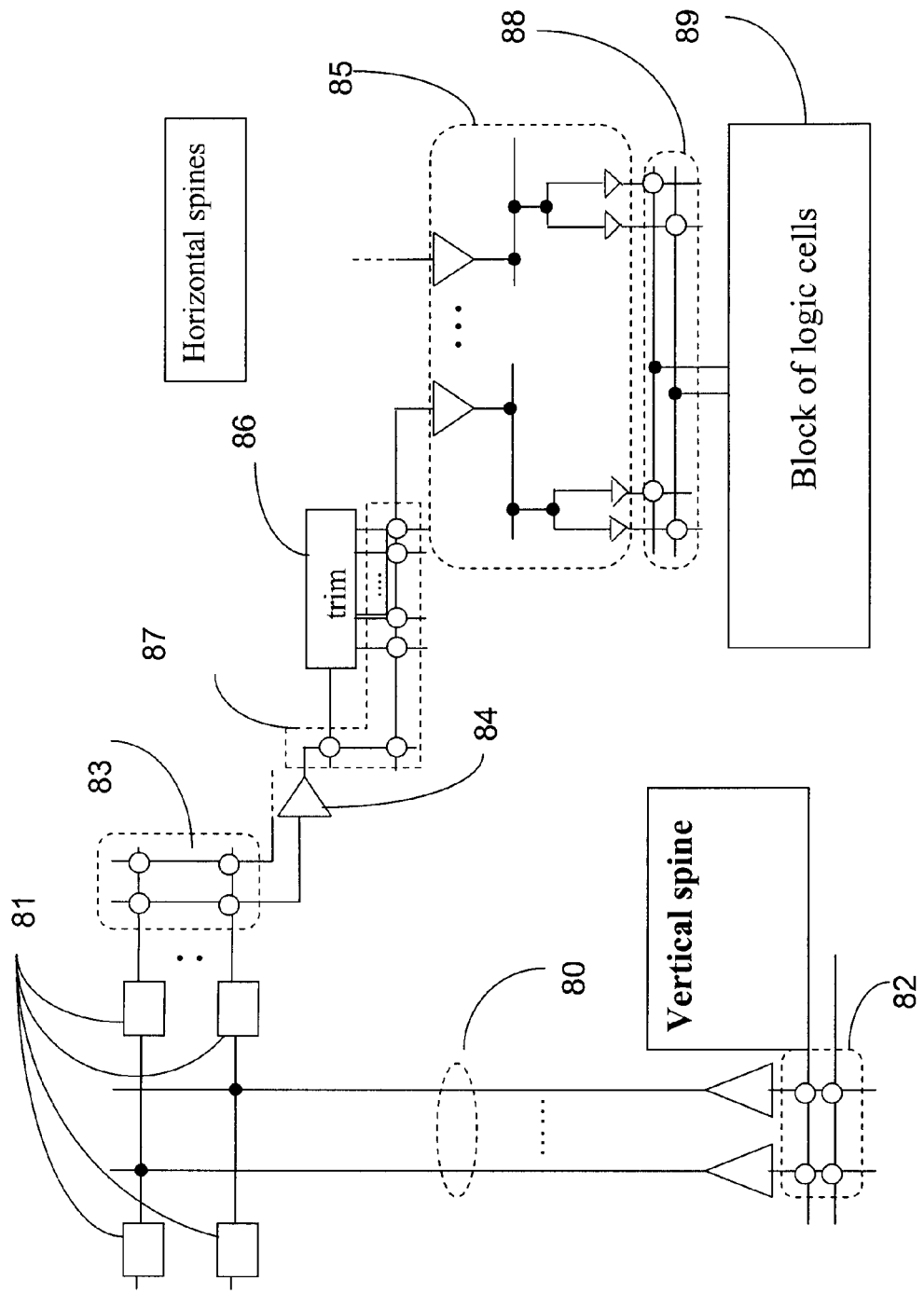
FIG. 8 is an illustration of a section of a configurable clock distribution structure.
Figure 9:
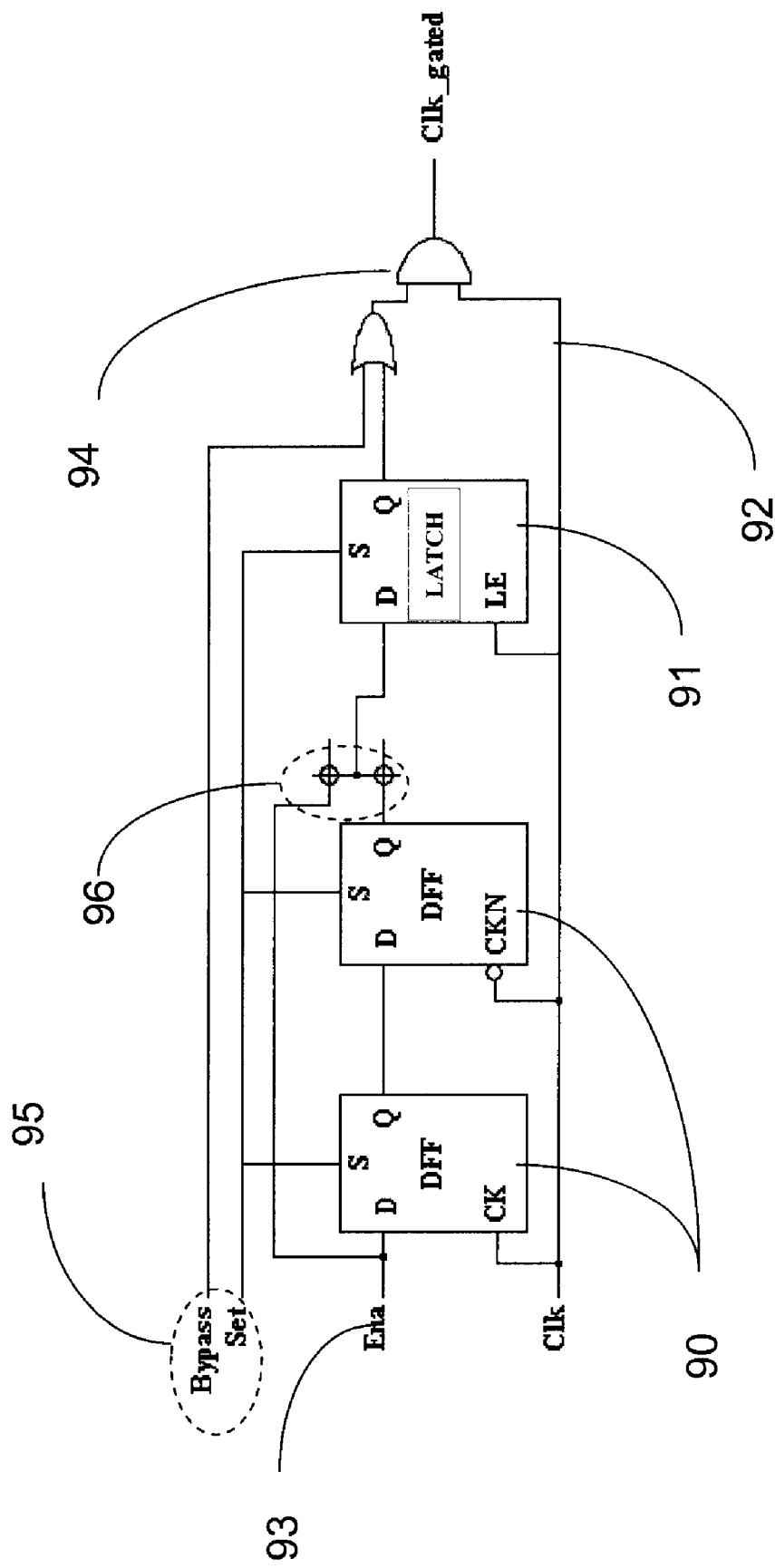
FIG. 9 is an illustration of a configurable clock enable, within a configurable clock distribution structure.

Reference is now made to FIG. 8, which is a detailed diagram of a portion of the configurable clock distribution structure shown in FIG. 1. The first level of clock distribution is a multiplicity of Vertical Spines 80, driven either from an Input buffer or from a PLL, which is driven by an input buffer, by setting the appropriate via on one of the via locations 82. Preferably the PLL has the ability to set the frequency and phase of the clock between a set of defined alternatives. In one preferred embodiment there are 32 Vertical Spines. Each Vertical spine drives a multiplicity of identical enable buffers 81, preferably one for each collection of horizontal spines. In one preferred embodiment there are 16 horizontal spines in each collection. For simplification, FIG. 8 shows fully only one of one collection of horizontal spines off of only two possible vertical spines. The Vertical and collections of horizontal spines are represented by the vertical and horizontal lines 16, shown in FIG. 1. Each buffer 81 of the Vertical spines can be selectively connected to one of the collection of horizontal spines by the selective placement of a via in one of the available via locations 83. Preferably, such vias are on the via layer used to configure the logic array. Each horizontal spine consists of buffers 84, a trim circuit 86, via locations to route around or connect to the trim circuit 87, distribution buffers 85 and via locations 88 to connect a horizontal spine clock to one of two clocks on one block of logic cells 89 in the logic array. When connected, the trim circuit 86 may be further customized to achieve a desired delay between the horizontal spine buffer 84 and the distribution buffer 85. Preferably such via locations are on the via layer used to configure the logic array. Each enable buffer as shown in FIG. 9, further comprises via locations 96 to selectively connect one or more flip-flops 90 into the input of a latch 91, all of which are gated by the clock 92, the output of which gates 94 the clock 92. Preferably such via locations are also on the via layer used to configure the logic array. The flip-flops 90 delay a user enable signal to gate the clock 92. The latch ensures the enable signal does not glitch the clock. User-definable set and bypass signals 95, allow the user to override the enable logic.

Figure 37:
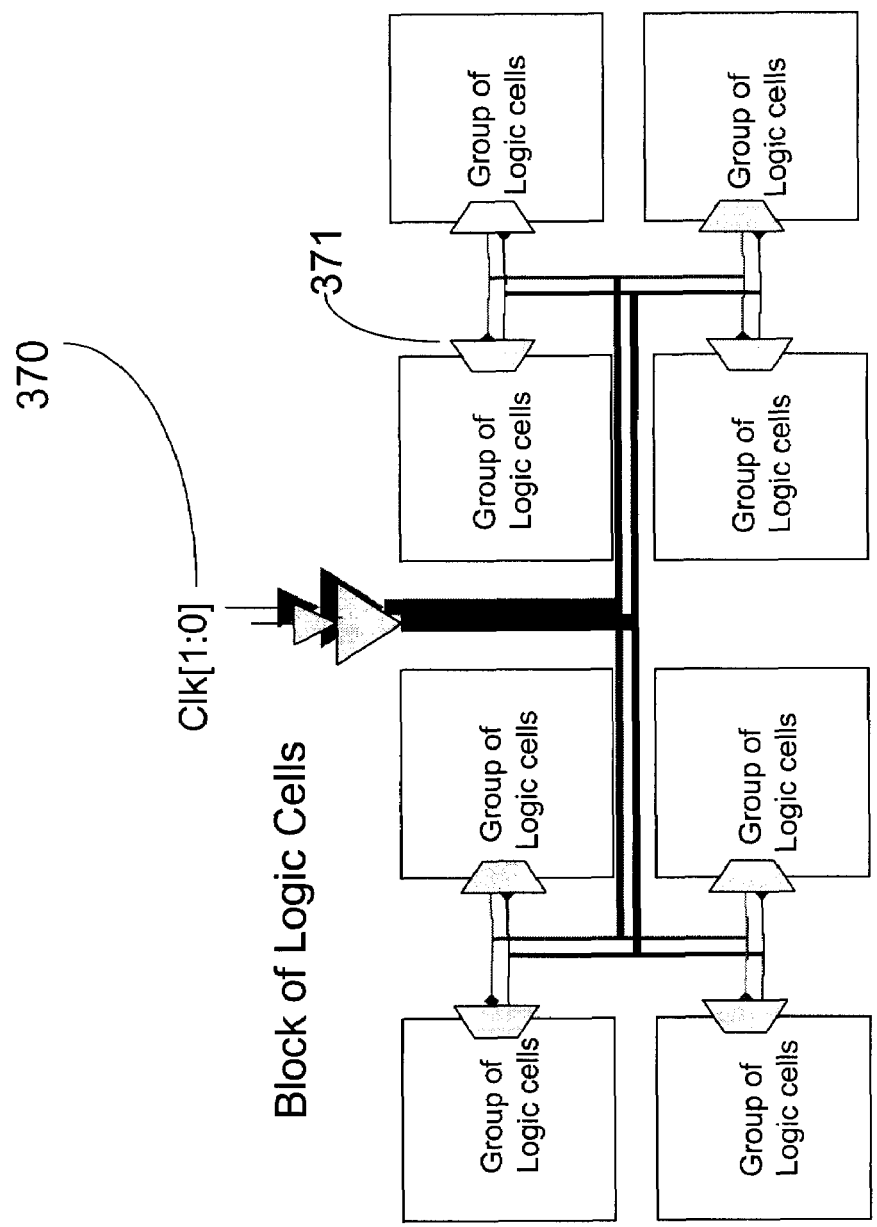
FIG. 37 is a diagram of an exemplary clock distribution within a block of logic cells.

In this fashion, preferably any one of 32 clocks can drive the flip-flops 22 shown in FIG. 2, of any group of 256 logic cells. Such a group can be seen in FIG. 12. Six such groups may form a block of logic cells as can be seen in FIG. 37. Either of two clocks 370 that are customized to be inputs into the block of logic cells may be selected at each group of logic cells by a multiplexer 371.

Figure 38:
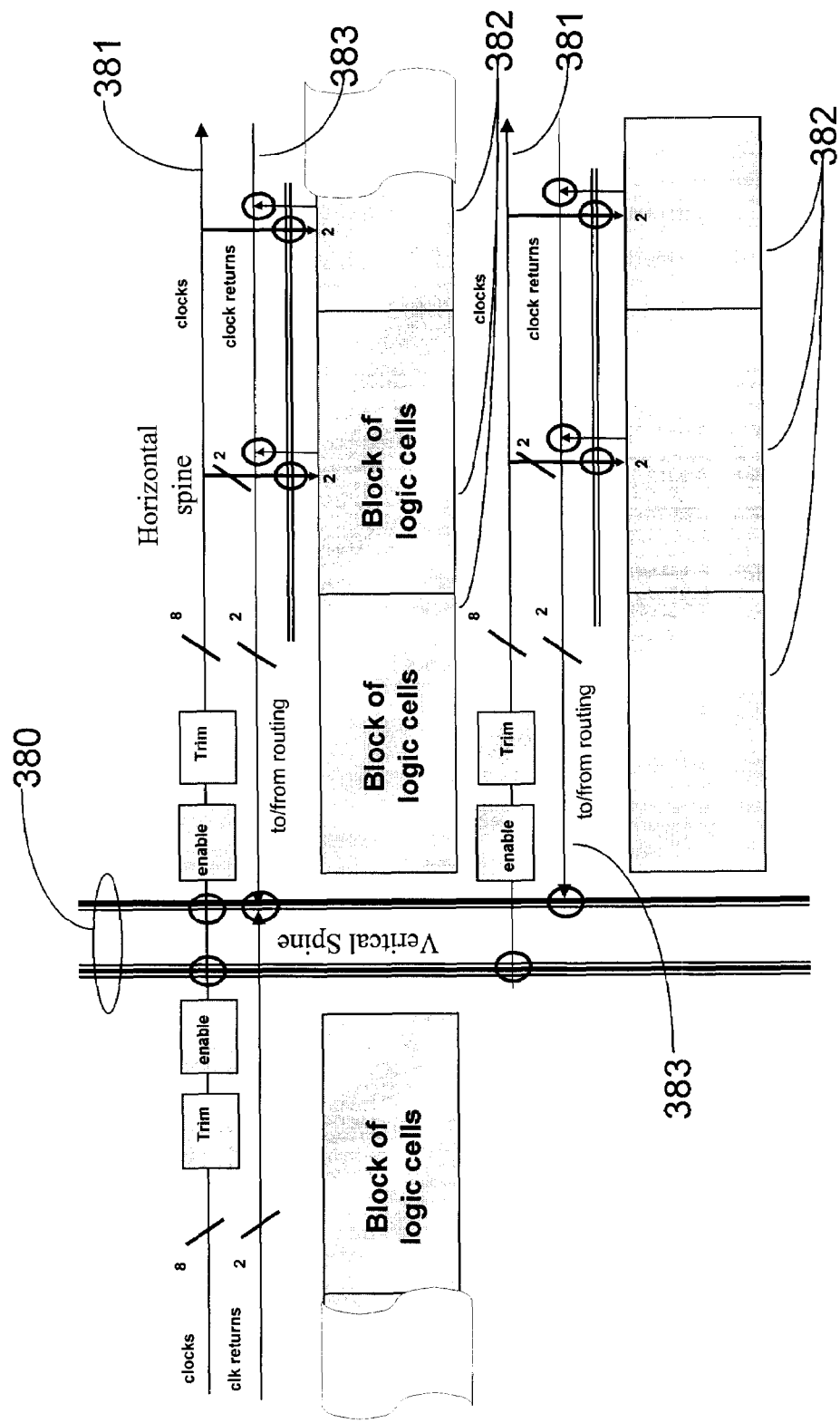
FIG. 38 is another diagram of an example of customized interconnection for clock distribution.

Reference is now made to FIG. 38, which shows, in addition to the vertical spine interconnect 380 and horizontal spine interconnect 381, a single line from each block of logic cells 382, which may be customized to drive a clock return signal 383 to any of a number of PLLs, for use in tuning each clock.

Figure 39:
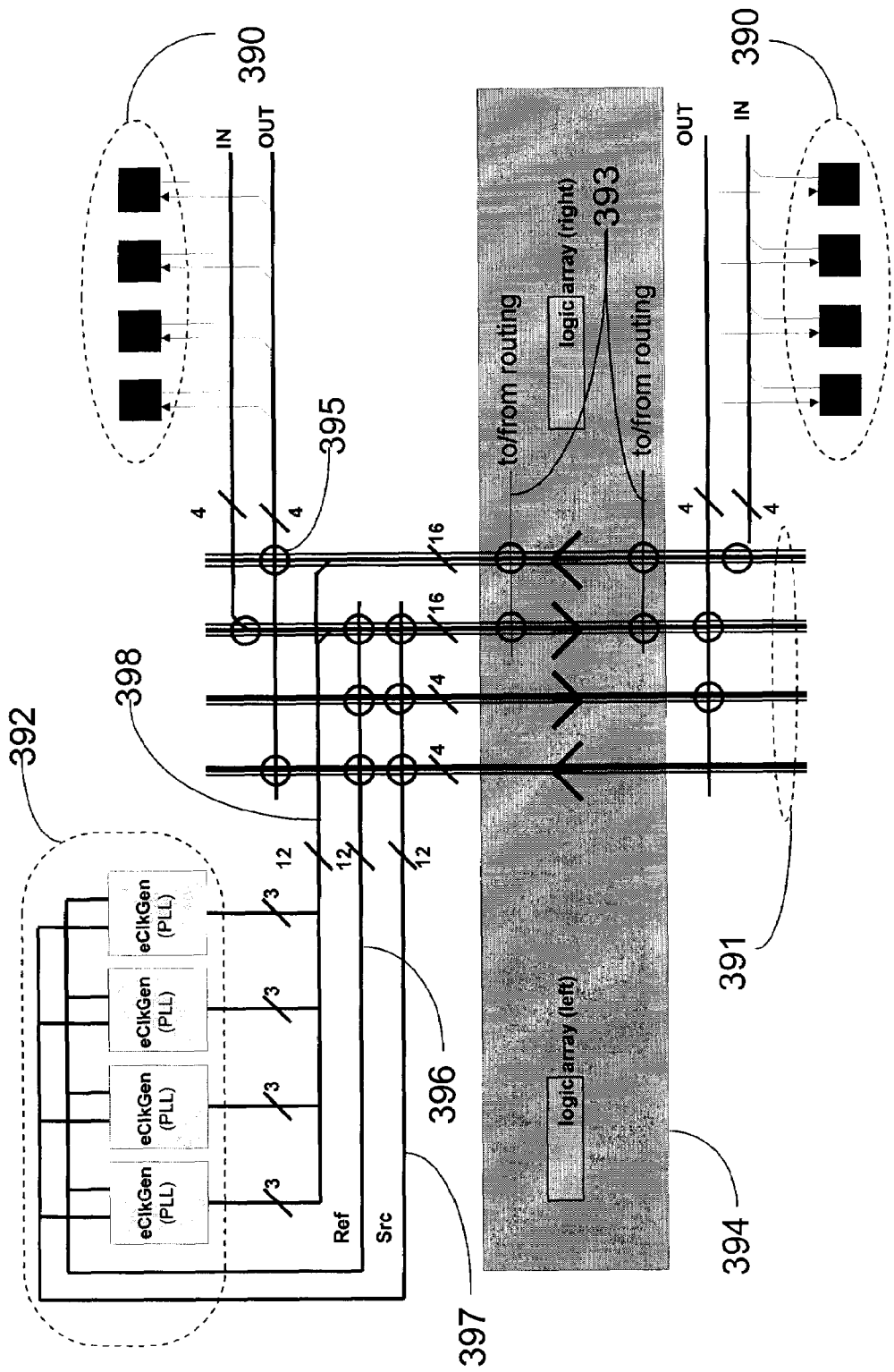
FIG. 39 is a top level diagram of an example of customized interconnection for clock distribution and feedback.

Reference is now made to FIG. 39, a diagram of the top level of the clock structure. The vertical spine signals 391, by customizing selected vias 395, may be connected to any of 8 I/Os 390, four PLLs 392, and the from/to routing 393 in the logic array 394. Up to 12 reference 396 and 12 source 397 signals may be connected into the PLLs 392, any one of which may come from either the I/O 390 or the logic array 394, and up to 12 clock output signals 398 may be connected into any of the clock inputs in the logic array 394.

Figure 40:
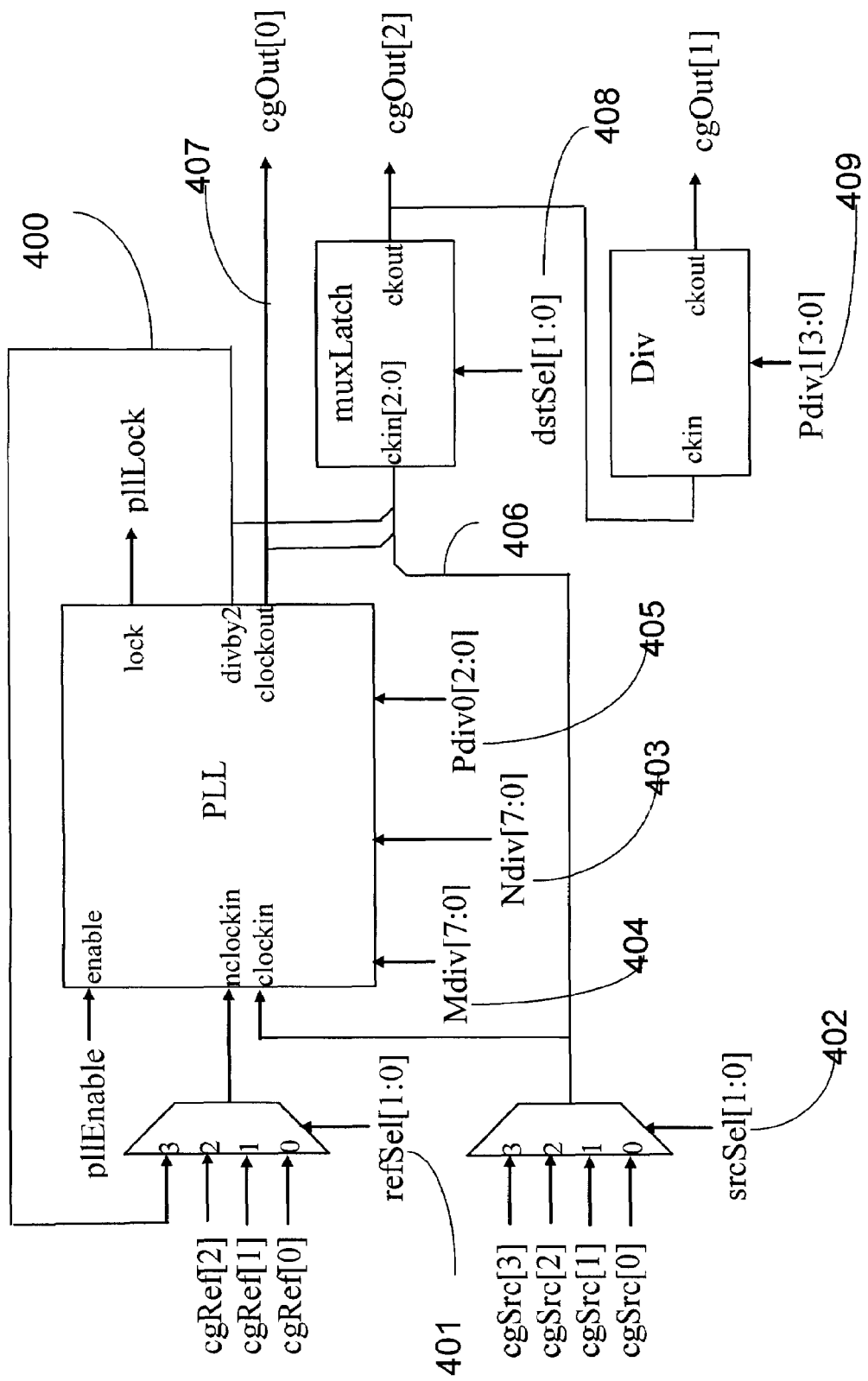
FIG. 40 is a logical diagram of a PLL.

Reference is now made to FIG. 40, a diagram of a single PLL. The microprocessor, when programming the PLL, may, by loading the reference select 401 and source select 402 registers, select among any of 3 external reference signals and one internal divide-by-2 signal 400, and among any of four source signals, which were connected to either I/O or clocks in the logic array, as was defined by the customization of the clock structure. Furthermore, the PLL may be programmed to produce a specific clock timing relative to these inputs by loading the Ndiv 403, Mdiv 404, and the Pdiv 405 registers. Finally, there are three PLL outputs; a primary output 407; a latched version of either the selected source clock 406, the primary PLL output 407 or the divide-by-2 signal 400, selected by loading a dstSel register 408; and this latched clock divided according to the contents of another Pdiv 409 register. So in yet another embodiment of the present invention, the source and distribution of a multiplicity of clocks is determined by customization, but the selection and generation of the actual clocks is determined by programming.

Figure 41:
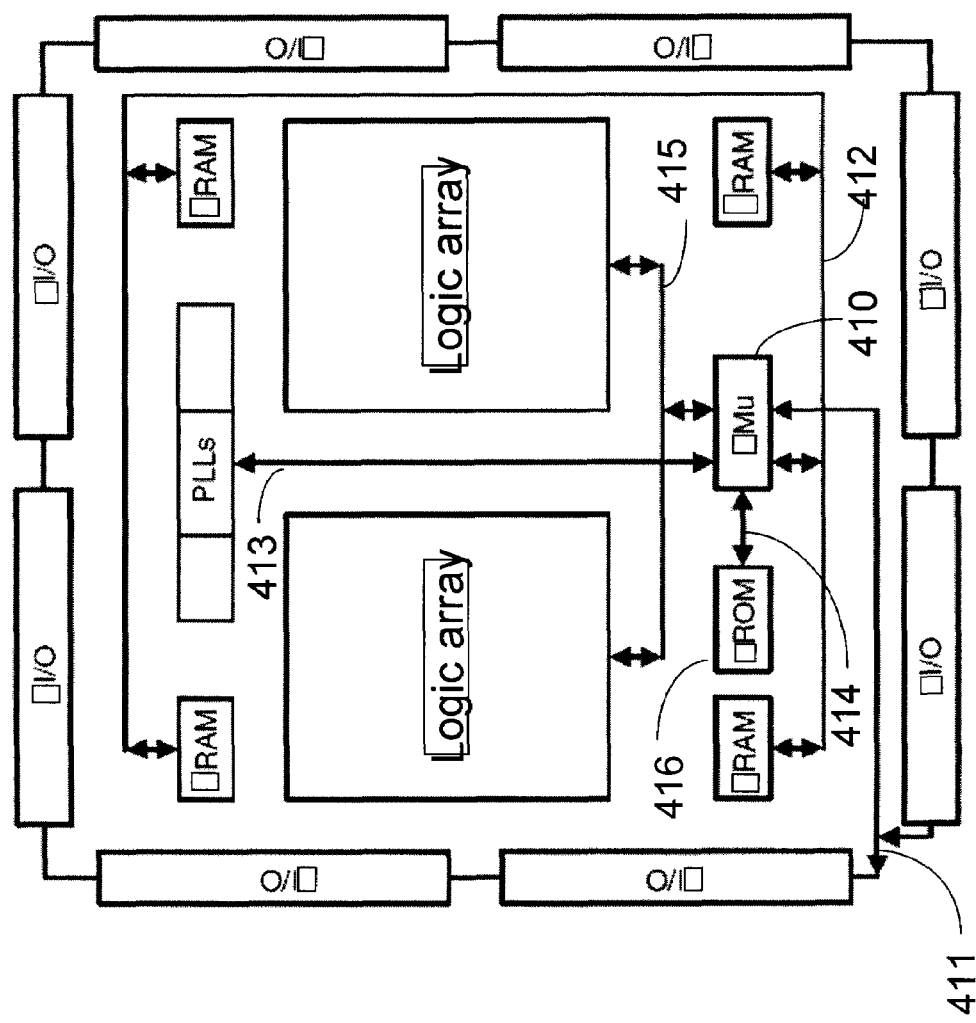
FIG. 41 is a diagram of exemplary internal interconnects between a microprocessor and logic array, RAM, ROM, I/O and PLLs.

Reference is now made to FIG. 41, which shows the hardwired internal connections between the microprocessor 410 and: the block RAMs 411, the JTAG boundary scan port of the I/O 412, the PLLs 413, the ROM 414, and the logic array 415.

Figure 10:
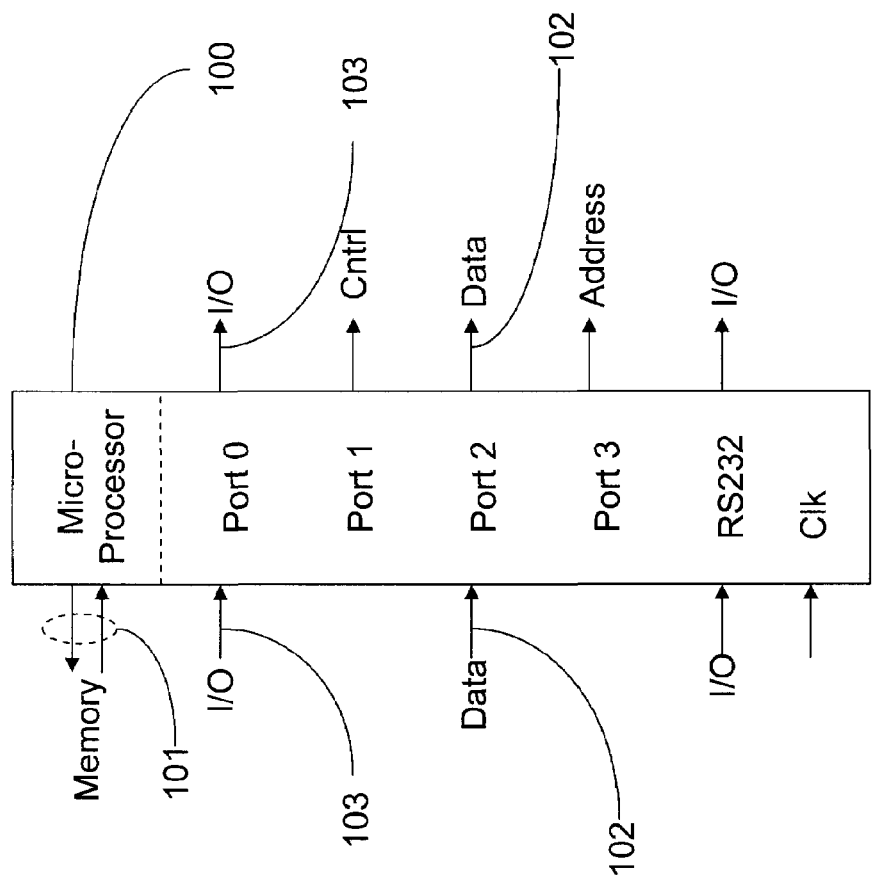
FIG. 10 is a block diagram of connections between an imbedded microprocessor and other on-chip blocks.
Figure 11:
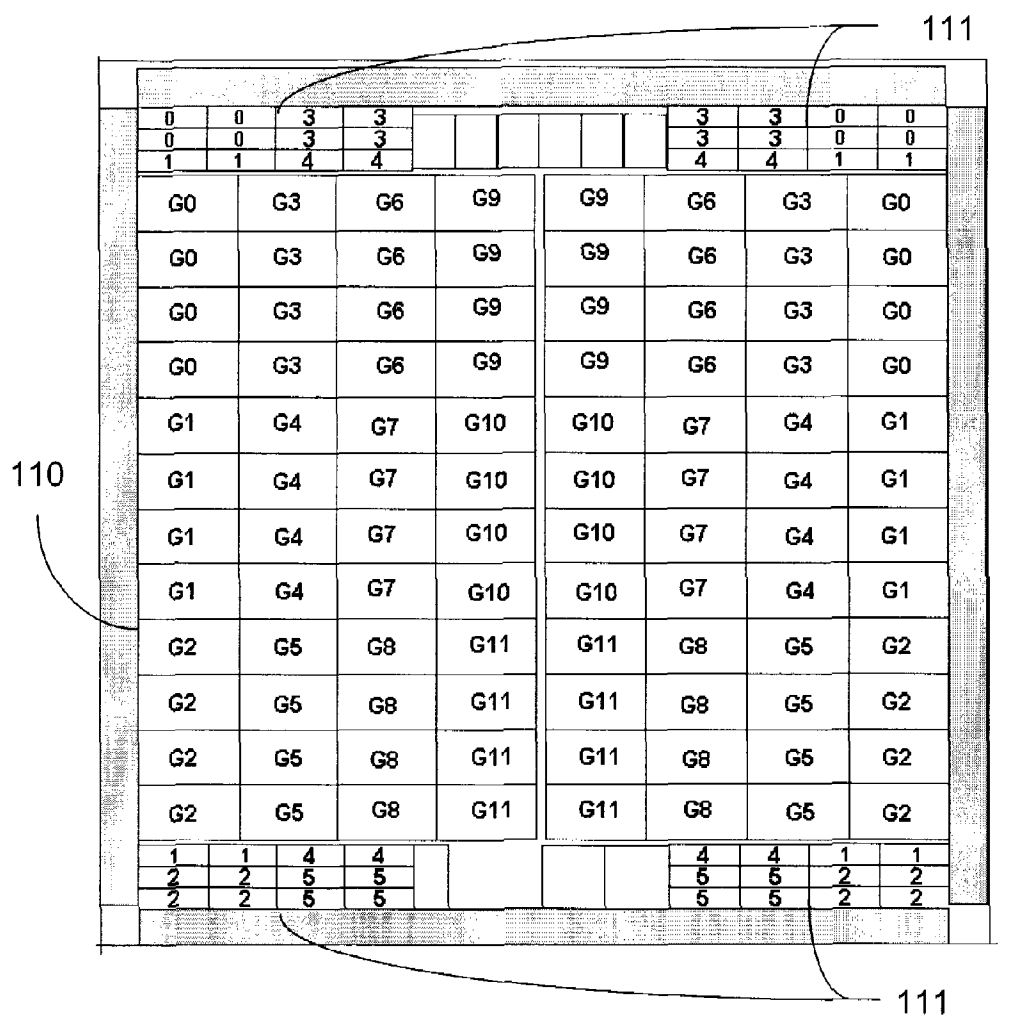
Figure 12:
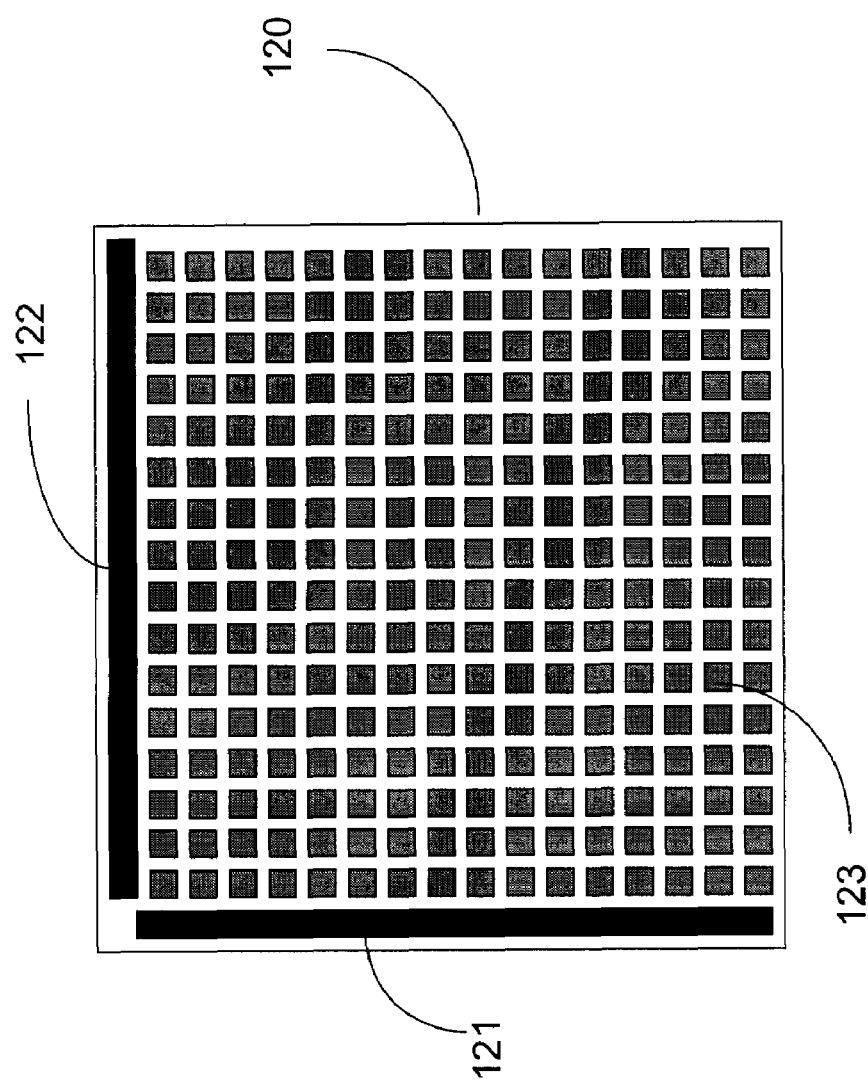
FIG. 12 is an illustration of a multiplicity of Look Up Tables with imbedded logic for configuring the Look Up Tables into a memory.

Reference is now made to FIG. 10, which shows the I/O to and from the micro-processor 17, shown in FIG. 1. In one embodiment the processor is an 8051, with four I/O ports, and an RS232 serial port. As the diagram shows, the input and output from port0 103 is dedicated to user defined communication. Selected via locations between a metal line from this port and the metal segments within the logic array (not shown) allow use of the Microprocessor 100 during normal operation of the Integrated circuit (IC). Port 1 is connected to control signals necessary put the IC into various modes of operation, such as normal operation, scan test, LUT and Memory access, and reset. Preferably these control signals also include controls to set the PLL clocks by selecting between reference clock frequencies and phases in a glitch free manner. The input and output on port 2 102 are dedicated to the transfer of data between processor, LUTs within the logic cells and RAM blocks on the IC. In one embodiment the RAM blocks contain a separate non-configurable port connected to the lines 102 from and to port 2, for observing and loading their contents separate from the RAM's usage by the user configuration. Port 3 is used to supply the address for reading or writing the LUT. The RS232 port is connected directly to I/O pins for debug access to the microprocessor and the rest of the IC. The microprocessor can either address external memory or the internal ROM block via the memory port 101. Control and address logic is included in the IC, connected to Port 1 and Port 3 of the microprocessor, to address the logic array and RAM blocks. FIG. 11 shows exemplary addresses of blocks of logic cells 110 in a logic array, and RAM blocks 111 within an IC. All the flip-flops within the logic cells in each block can be accessed by scanning the data in and out through the data port 102 shown in FIG. 10. As shown in FIG. 12, within each block of logic cells 120, which consists of 256 logic cells 123, there is address 121 and buffer logic 122 to access all the logic cells as if they were one contiguous memory.

In this fashion, a stream of external data may be loaded into the microprocessor for transfer into the RAM blocks and LUTs within the logic cells, and data may be scanned into the Flip-flops within the logic cells to completely configure the IC to begin performing a particular task. In one embodiment a different configuration of logic, more suitable for testing may be loaded into the LUTs, and patterns may be scanned into each of the strings of flip-flops such that normal scan based automated test pattern generator (ATPG) vectors may be loaded via the RS232 port into the IC, and results may be serially sent out through the R232 port. Furthermore, the results may be combined into a checksum or signature by the microprocessor. In yet another embodiment, a standard configuration for testing the IC may be set into the ROM block 416 shown in FIG. 41 by setting vias in the proper via locations such that, upon power-up of the IC, the microprocessor reads the configuration data from the ROM, loads the test configuration data into the LUTs and RAM Blocks, and repeatedly: generates pseudo-random scan bit values; loads them into the scan strings of flip-flops; clocks the logic array; scans out the contents of the flip-flops, adding the results to a signature, for a prescribed number of cycles; and then compares the resulting signature to a signature stored in ROM memory. In this fashion, the chip can perform a complete bring-up test without any external data. Upon determining the computed checksum is correct, the microprocessor can begin loading the external user configuration data.

In another embodiment of the present invention, the standard configuration may include a single copy of LUT data, which may implement an XOR or XNOR function, and which may be applied to all LUTs in the IC. The advantage of using XOR or NXOR logic is that it propagates any single change in the input to the output regardless of the logic state of the other input signals. NAND logic, for example, allows the input change to propagate only if the other inputs are at a high "1", which requires twice as many test vectors to test a NAND-3 device, including its input connections, than to test a XOR-3, including its input connections. Since many designs have four levels of logic between Flip/Flop (F/F) devices, the number of iterations of pseudo-random scan bit values required to adequately test a complex circuit may thus be reduced by an order of magnitude using this technique.

In yet another embodiment of the present invention, the microprocessor boot process may be initiated by a configuration reset signal. If boot information is in external memory, it is loaded into the first RAM block; otherwise, ROM is selected. The microprocessor then unlocks the output port registers and fetches device configuration data from external memory, copying the accessed data into the port registers or RAM memory. A CRC is computed while reading this page, and the computed CRC is compared to the CRC stored in the last four bytes of the configuration data. If the CRC values do not match, an error value is set on port0, and device initialization terminates. If the CRC values match, device initialization continues with the Built-In Self Test (BIST) operations. In an exemplary mode of operation, the BIST operations that will be performed are specified in the configuration data. If all operations are to be performed, the order of operations is SRAM BIST, then LUT BIST, then LOGIC BIST and then Device Test. Operations that are not selected are bypassed. At the end of BIST operations, the I/O bits of Port 0 of the microprocessor, as shown in FIG. 10, are set to reflect the status of the BIST results.

After the BIST operations are complete, the logic array is programmed or configured. During logic array configuration, the microprocessor traverses a linked list of pages that contain the logic array configuration data. During configuration, the microprocessor computes the CRC for each page. If a CRC error is detected, bit 1 of I/O_port0 is set, and configuration is terminated. If all pages are read correctly, configuration continues with "clkGen configuration". During clkGen configuration, the microprocessor initializes the PLL M, N, and P values as defined in the device configuration data structure (see, e.g., FIG. 40). It then enables the PLLs and polls the cgReg[PLL_STATUS] bit until lock is detected. A timer is run in parallel with the cgReg[PLL_STATUS] bit poll. If lock is not detected within the PLL lock time limit, the second bit of I/O_port0 is set and configuration is terminated. If lock is detected, bit 3 of IO_port 0 is set, the user operation is unlocked and configuration is completed. At that point in time the user logic begins operation, and the microprocessor executes a breakpoint and halts.

Figure 13:
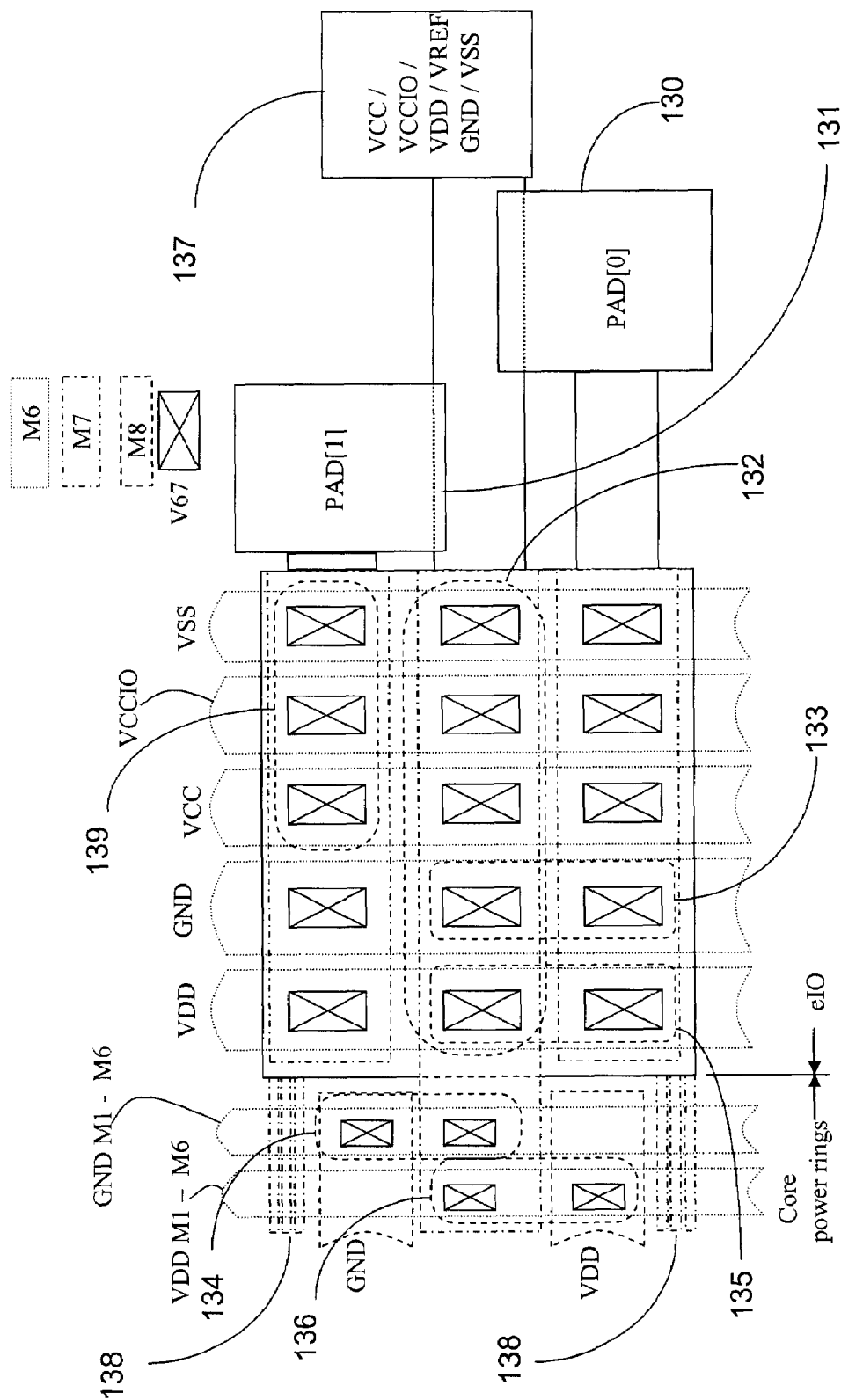
FIG. 13 is an illustration of Pads on the outer row.

Reference is now made to FIG. 13, a sideways illustration of Pad layouts with dedicated P/G (power/ground) on the outer row. There are three rows of pads, two signal pads 130 and 131, and a pad dedicated to Power or ground, only 137. The signal pads can each connect to an I/O cell through wire 138. FIG. 4 also shows the signal pads 47. In FIG. 13, one or more selective via locations 132 may be filled with vias to connect the dedicated power/ground pad 137 to one or more internal and I/O power supply lines. If the dedicated power/ground pad 137 is used for internal power or ground, vias may be filled to either connect the pad 137 to internal ground 134 or internal power 136. Any signal pad can be used as an I/O power or ground pad. For example, the inner signal pad 131 may be connected to the I/O power or ground by placing a via in the proper location 139. Furthermore, if the dedicated power/ground pad is unused, one of the signal pads may be used as internal power or ground. For example, the outer signal pad 130 can be connected to the unused third pad by filling a pair of via locations through power 135 or ground 133, and then the unused power/ground pad can be connected by filling another pair of via locations to internal power 136 or ground 134. In a preferred embodiment, the via locations are preferably on the same via layer as the via locations for the logic array.

Figure 14:
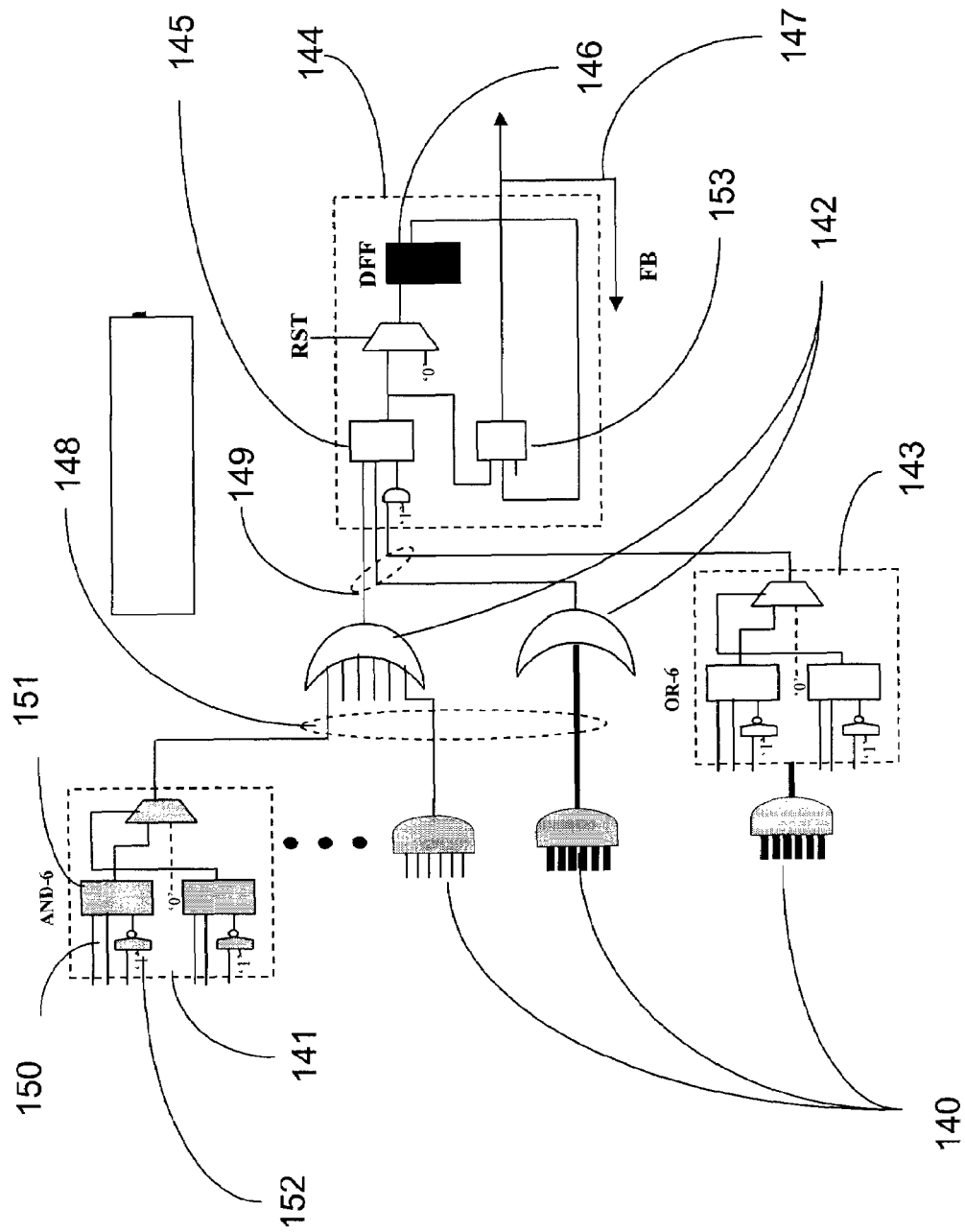
FIG. 14 is an illustration of a programmable logic device (PLD) structure comprised of logic cells.

In yet another preferred embodiment of the present invention the metal interconnect between logic cells in an array may be customized such that one of many possible functions may be programmed into the array by programming the LUTs within the logic cells. One such example is a PLD structure. Reference is now made to FIG. 14, an illustration of one output of a soft programmable PLD structure comprised of logic cells. Typically, a PLD is comprised of a set of inputs that selectively connect into multiple AND functions, whose outputs connect into an OR function for each output which is registered, before optionally feeding back into one or more of the AND functions. Which inputs are connected to which AND functions and which AND functions connect to the OR function for each output is programmable by the user. FIG. 14 shows a 6-input 18-term single output PLD. Each AND function 140 is mapped into a single logic cell by setting vias at the proper via locations to configure both LUTs into a single AND function. The output of each AND function is routed 148 by properly selecting vias to connect metal segments between the AND functions and inputs to the OR function. The OR function 142 for each output is comprised of logic cells configured into an OR function 143, which are further connected through a routing of metal segments and selected vias 149, to the inputs of another logic cell 144, which is configured to OR 145 the inputs and optionally register 146 the result by selecting between the OR term or the register output in the other LUT 153, whose output is fed back by connecting other metal segments with selected vias 147 to one of the inputs. In this manner a PLD is constructed out of logic cells and metal interconnects, by selecting the proper via locations to fill on the preferred via layer.

To program the PLD, any input may be disconnected from any one of the AND terms by selectively changing the contents of the respective LUT. Furthermore, any of the AND terms may be disconnected from the OR term by changing the contents of the respective LUT. Each LUT is a single-output 8-bit memory with three address bits as inputs, and as such can contain any function of the three address bits, including ignoring changes on any specific input. For example, the first pin 150 of the logic cell 141 containing an AND function can be eliminated by the user by changing the LUT's 151 function from AND(XA,XB, NOT(C)) to AND(XB,NOT(C)). This corresponds to changing the contents of the LUT 151 from 0,0,0,1,0,0,0,0 to 0,0,1,1,0,0,0,0, since the pin 150 is connected to Address 0, logical pin XA of the LUT 151. Initially, because the NAND gate 152 drives Address 2, logical pin C, on the LUT 151, a normal AND function, 0,0,0,0,0,0,0,1, in the LUT 151 must be modified to 0,0,0,1,0,0,0,0 or logically from AND(XA,XB,C) to AND(XA,XB,NOT(C)), to create a 4-input AND function. By inserting the additional 1 in the third bit of the memory, address 0, logical pin XA no longer affects the output, eliminating it from the logical function. In a similar fashion as described above, any input polarity may be changed, any OR inputs may be eliminated, and either the last OR term 145 or the register 146 output may be selected.

In yet another preferred embodiment, the preferred via layer, which configures the ROM, RAM, and I/O within the integrated circuit device, may be fabricated by direct wafer exposure from electronic data containing the locations of the vias to be created on the via layer. Typically, the processing would be as follows:

a. Process all the semiconductor devices with traditional mask lithography, from the beginning of the process through device and metal layers up to the preferred via layer.

b. Hold the wafers before this layer.

c. When enough product has been ordered for each wafer, select which customer designs to expose, load them electronically into the direct wafer exposure equipment, along with a map of the wafer.

d. Expose the wafer by applying the custom via layer for each customer design on the site determined by the map of the wafer.

e. Process the wafers with the customized via exposures.

f. Process wafers with standard mask lithography for the rest of the metal layers.

g. Test the wafer, electronically load the specific customized test pattern for the design at the site being probed.

h. Dice, sort and package the parts based on their packaging requirements.

i. Perform package test, again electronically loading the specific customized test pattern for the specific part's design, and sort the parts that pass.

Figure 15:
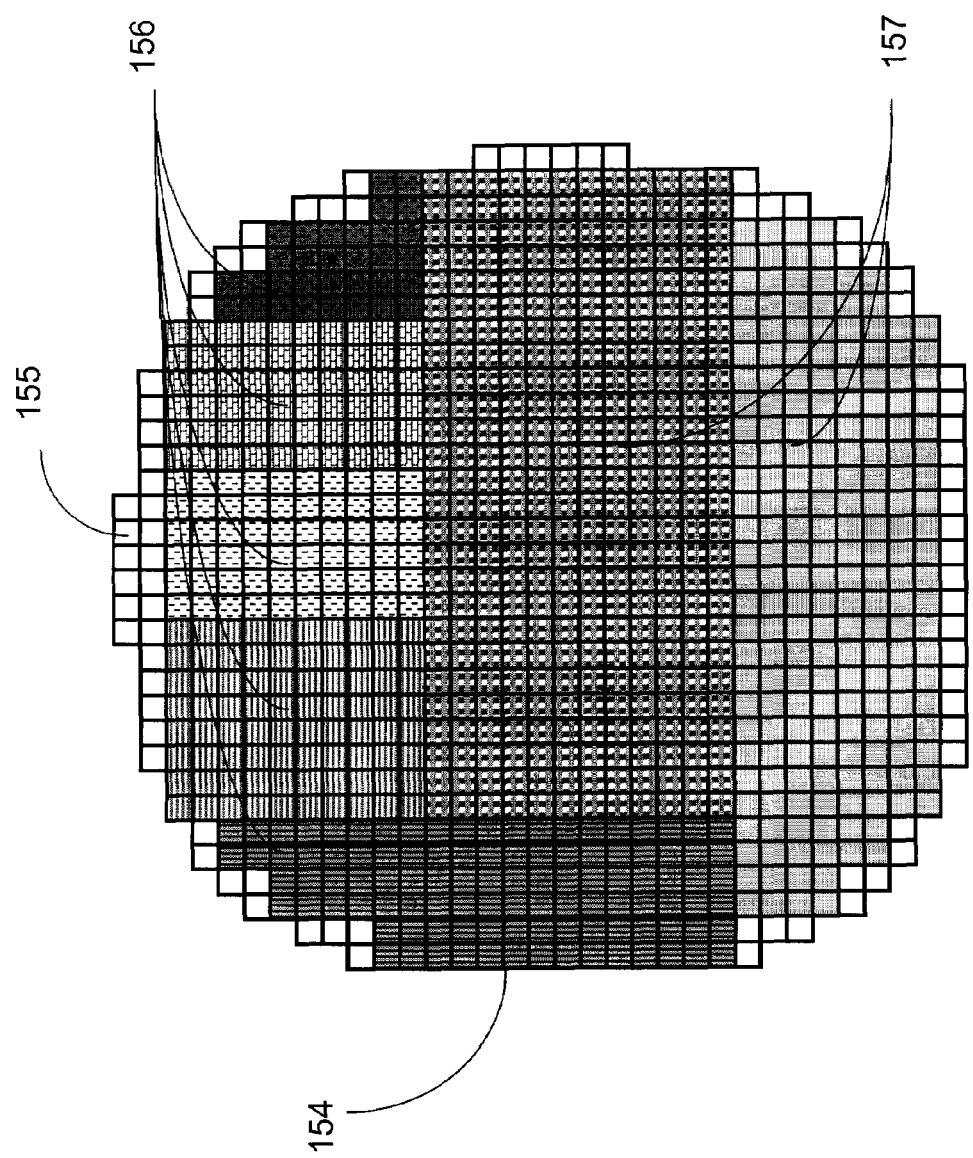
FIG. 15 is an illustration of a wafer map for customizing multiple designs on one wafer.

FIG. 15 is an illustration of an exemplary wafer map as mentioned in step 3 above. The wafer map 154 contains sites for each die location 155, shaded by the customer designs to be placed at that site. Some designs are placed at a limited number of sites 156, to obtain, after processing, at least prototype quantities (~10) of good chips. Other designs 157 are added to the wafer when pre-production quantities (~100s) of chips are needed. Preferably, the custom via layer is as near the end of the processing as possible to provide the required customization. This technique allows a continuous flow production facility to produce custom parts in varying quantities with reasonably short manufacturing time for the customization portion of the manufacturing (steps 4 through 9).

Reticles, the masks for fabrication of semiconductor components, typically are much larger than the chip designs contained on them. The reticles are stepped over each wafer manufactured in a two-dimensional array of reticle images. TSMC and other semiconductor manufacturers offer shuttle services where different sized chips are all placed on a single reticle.

Figure 16:
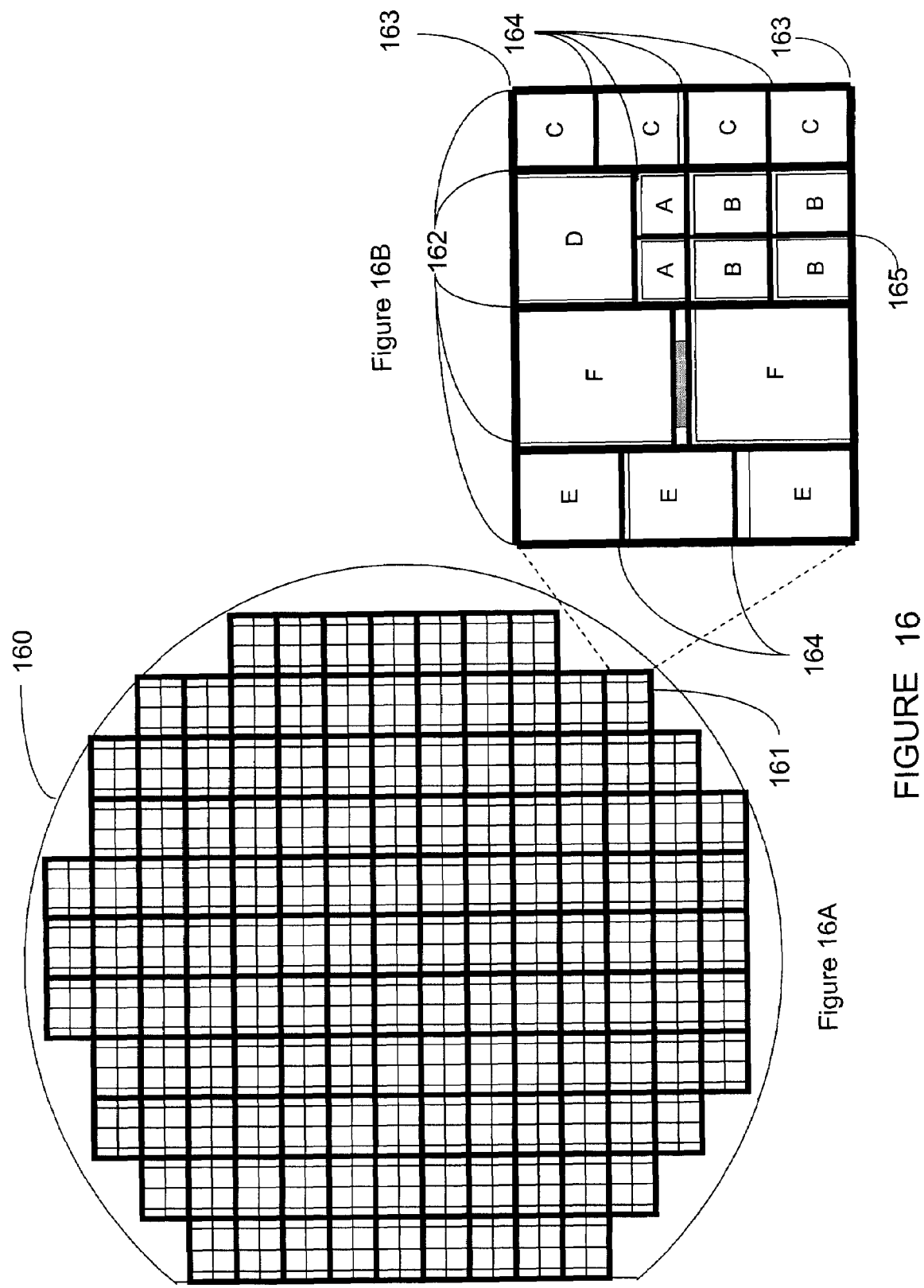
FIG. 16, consisting of FIGS. 16A and 16B, is an illustration of a wafer consisting of reticle images, which contain multiple dies of different sizes.

In another preferred embodiment, multiple dies of different sizes and quantities may be included on a single wafer for individual customization, illustrated in FIG. 16, which includes FIGS. 16A and 16B. In this example, different quantities of six different sized customizable chips (labeled A through F), such as previously described within this disclosure, are placed in a reticle, and a repeating pattern of reticle images 161 is created by stepping the reticle over a wafer 160. Each instance of these different sized chips may be individually customized, as also previously described within this disclosure. The dies within the reticle image 161, have been placed to initially scribe the continuous vertical lines 162. All strips may be subsequently scribed on the continuous horizontal lines 163. After breaking the die along the previously scribed lines, each strip may be individually scribed and broken on the horizontal lines 164, and finally, the smaller die may be separated by scribing and breaking on the internal vertical line 165. Other scribing and breaking sequences may be performed, including scribing through existing unused or bad die in order to minimize the number of breaks that must occur.

Figure 17:
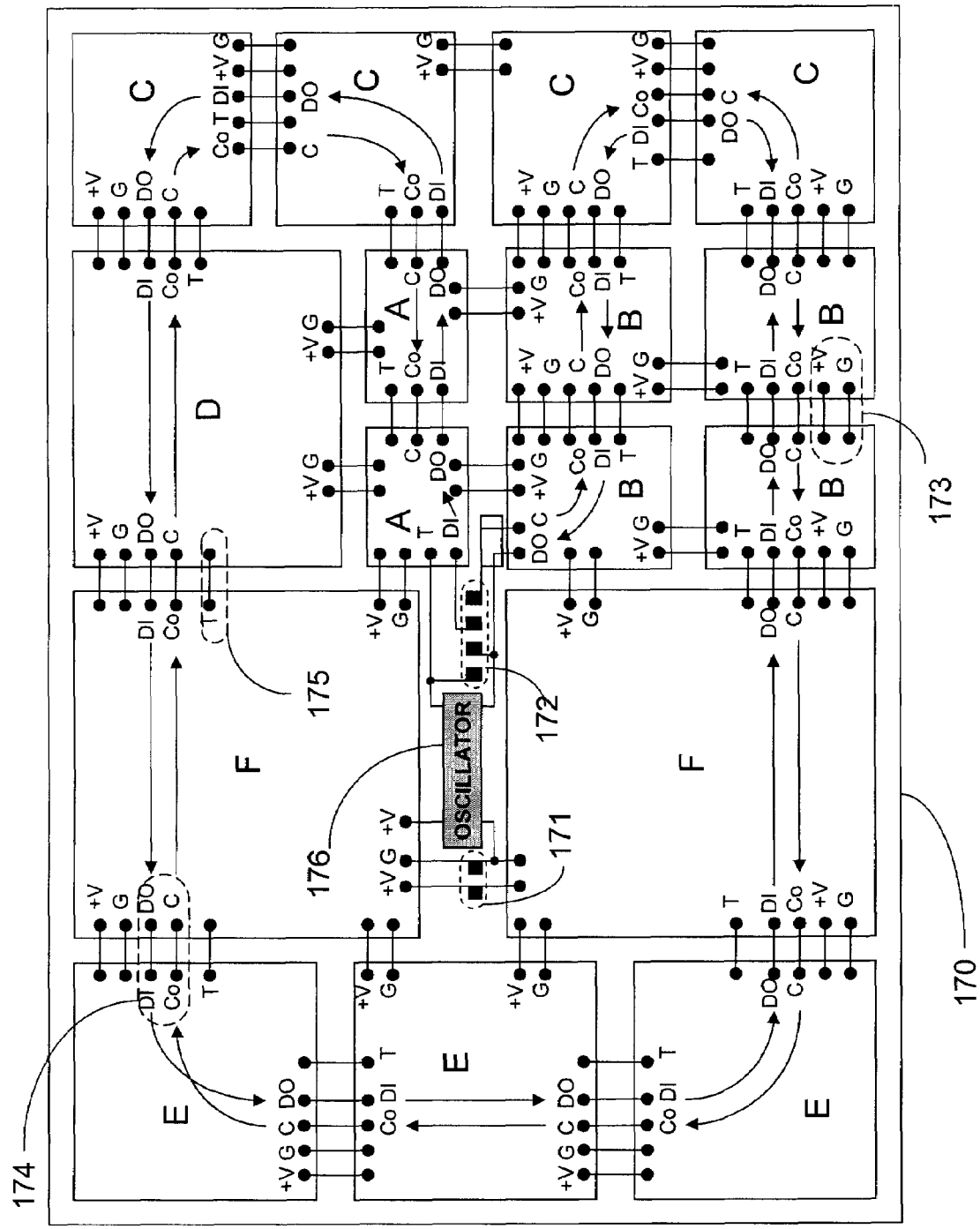
FIG. 17 is a diagram of inter-die interconnect for testing all die within a reticle image.

In yet another embodiment, all the customized die within a reticle image may be tested with a single probe of reticle image, utilizing a single common probe card. Jeng-Jyu Shau describes a full wafer test technique in U.S. Pat. No. 6,427,222, which interconnects the power, clock and test pads of all the die on a wafer. While Shau has anticipated the issues with subsequent scribing of the interconnecting metal lines, Shau's technique can be constrained by power consumption and reticle image alignment issues, avoided in the approach illustrated in FIG. 17. Similar to Shau's approach, a single layer of metal may be deposited following the normal processing of the wafer, but in this case, the resulting metal interconnects are solely within each reticle image 170. Here a single probe of pads 171 and 172 is sufficient to power and test all the components within each instance of a reticle image on the wafer. Similar to Shau's approach, power and ground pins 173 of adjacent chips are connected together to form a grid powered by their respective probe pads 171, and the test enable 175, clock, data in and data out pins 174 are serially connected from their primary pads 172, through each of the chips on the reticle image. In order to limit the wiring to a single metal layer, the test enable and clock must be distributed on each chip, from their inputs to an output to the next chip. In one embodiment these test signals may be JTAG signals, and the process of test consists of using the serial chip protocol of JTAG to initiate the scan-based, bring-up test built into each of the customized chips. The DO pin then serially receives the confirmation of the correct completion of each chip's bring-up test. These tests may be done serially or in parallel, depending on the power consumption limitations of the probe. Following testing and marking, the metal may be removed by normal semiconductor processing. As such, step 7 of the fabrication process may be changed to utilize this approach for testing.

Figure 18:
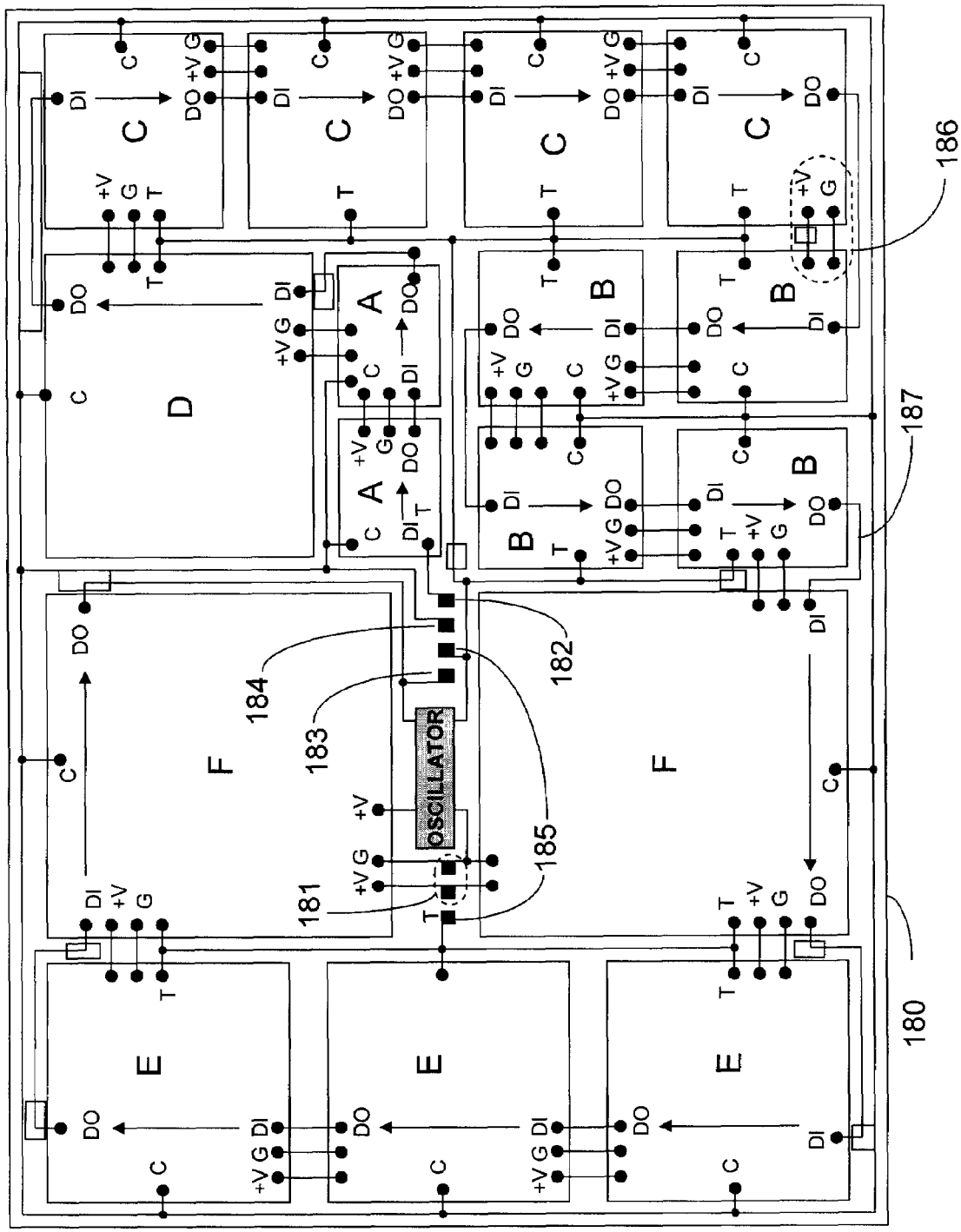
FIG. 18 is alternative diagram of inter-die test interconnect within a reticle image.

When interconnecting multiple dies on a reticle image for testing, it is desirable to keep the chip designs the same for each copy on the reticle image, and not have to internally distribute signals through the chips for testing other dies. In FIG. 18, the power and ground 181, data in 182, and data out 183 signals are serially connected through all the dies on the reticle image 180. The clock 184 and test enable 185 signals are distributed in parallel to all the chips in the reticle image. Note, the power and ground pins may be connected to any adjacent available power and ground pins 186 to distribute their voltages, but the clock, test enable, data in and data out pins are in the same locations for each copy of any given type of die, necessitating some routing of the signals 187 between them. Still, by limiting the interconnections to a single reticle image, and employing the scribe area between reticle images, the necessary interconnect may be done on a single layer of metal. In both FIGS. 17 and 18, test enable may be used to alternatively enable the oscillator and the scanning of the dies on the reticle image, thus enabling the testing of all components on the reticle image with a single probe.

Figure 19:
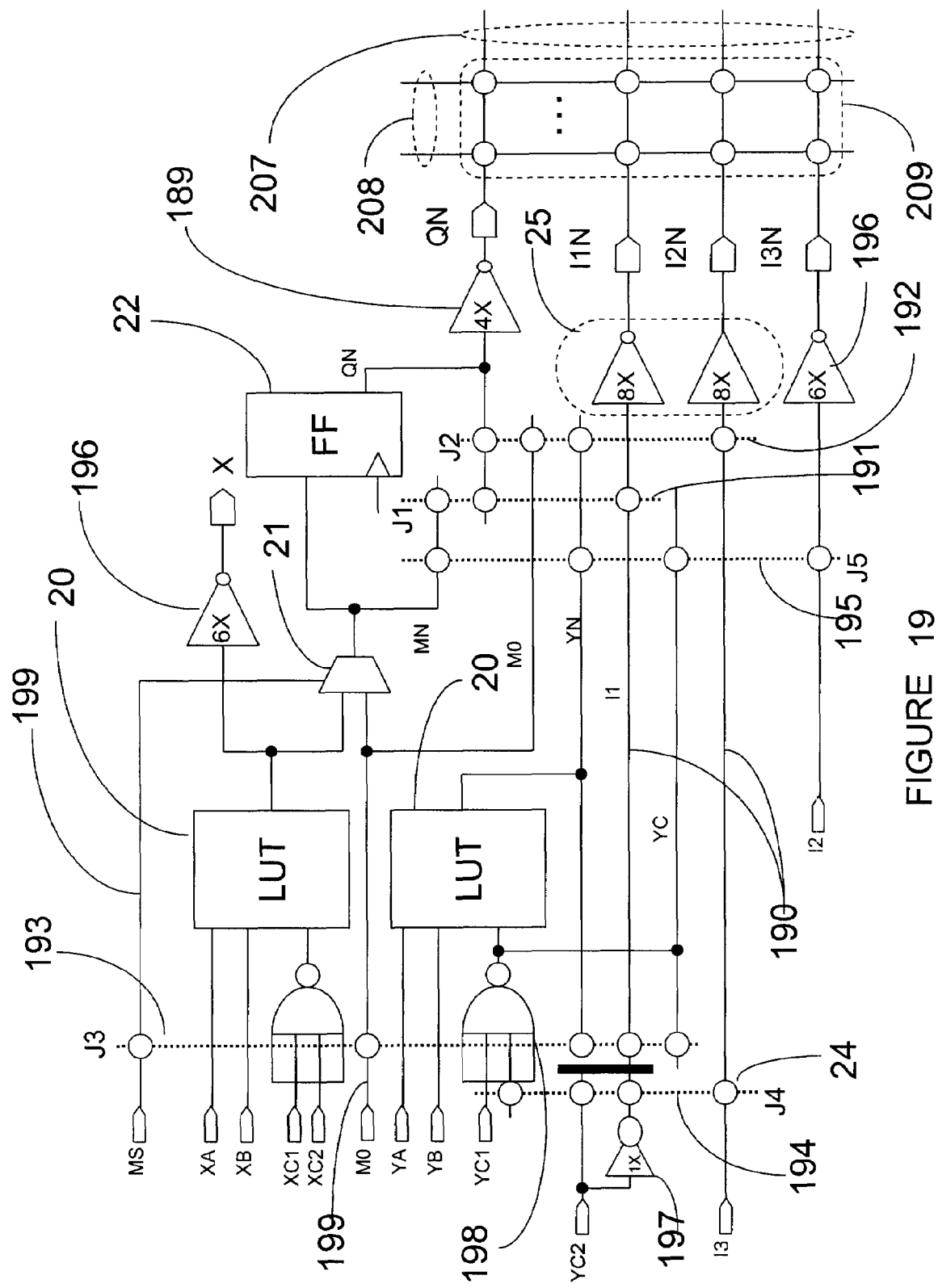
FIG. 19 is alternative diagram of a logic cell.

In contrast to FIG. 2, a preferred embodiment of the present invention is the logic cell shown in FIG. 19. Similar to FIG. 2, it contains two buffers connected to outputs 25 of 8× size, a multiplexer 21 and various via locations 24 to customize the logic cell, but it also contains two additional output buffers 196 of a different size (6×), an additional input inverter 197, two primary inputs 199 to the multiplexer and five jumpers 191-195, each of which has a number of via locations to customize. These additional five jumpers provide for many more customization options than available with the prior art. For example, the inverter 197 may be optionally connected to an input of the NAND gate 198 or one of the output buffers 25. Also, while both cells contain two LUTs 20 and a Flip-flop 22, the jumpers 192 and 194 in the improved cell may be used to feed the output of the Flip-flop 22 back into the input of the NAND gate 198. Similarly, data gating functions can be implemented by utilizing jumpers 191 and 193 to feed the output of the Flip-flop 22 back to one of the two inputs 199 of the multiplexer 21, which can only be done by external wiring in the prior art cell.

Furthermore, in another preferred embodiment of the present invention, selection may be made by the proper customization of vias connecting either the 4× output 189 of the FF 22 or one of the 8× outputs 25 to the internal output of FF 22 without changing the interconnect between logic cells. The outputs 189 and 25 of the logic cell are connected outside the cell to short horizontal segments 207, which may be connected to short vertical segments 208 by proper placement of vias 209 in a customized via layer between them. Further connections between these and long segments on two other layers form the interconnect between the logic cells. They can be seen in greater detail in FIGS. 23 through 30, and are described later in this disclosure. Now, any one of the three outputs may be selected, without changing the routing on the segments beyond the connections to the logic cells, by merely selecting the proper vias on the jumpers 191,192, or 195 to connect the selected output and connecting that output's specific horizontal wire to the originally routed vertical wire, and disconnecting the original output. Furthermore, such selection may be done following place and route, as needed to meet any timing constraints that still exist.

Figure 20:
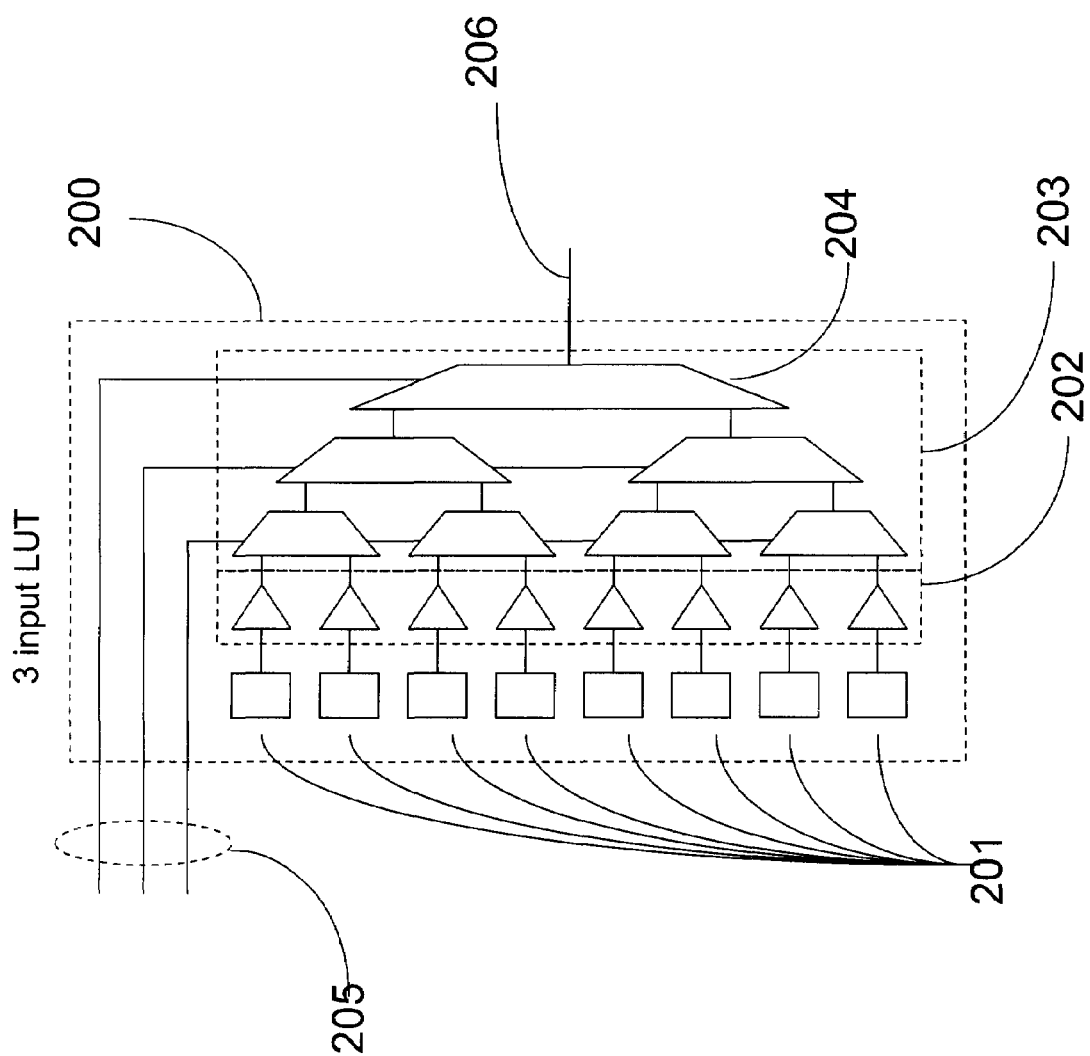
FIG. 20 is a diagram of a three-input look-up table (LUT)

Reference is now made to FIG. 20, which is a logical diagram of a 3-input look-up table 200, consisting of a set of eight programmable memory elements 201, driving eight buffers 202 and three stages of multiplexers 203, driven by the LUT's three inputs 205, resulting in the output of one of the eight programmable memory elements 201 being driven out the output 206.

Figure 21:
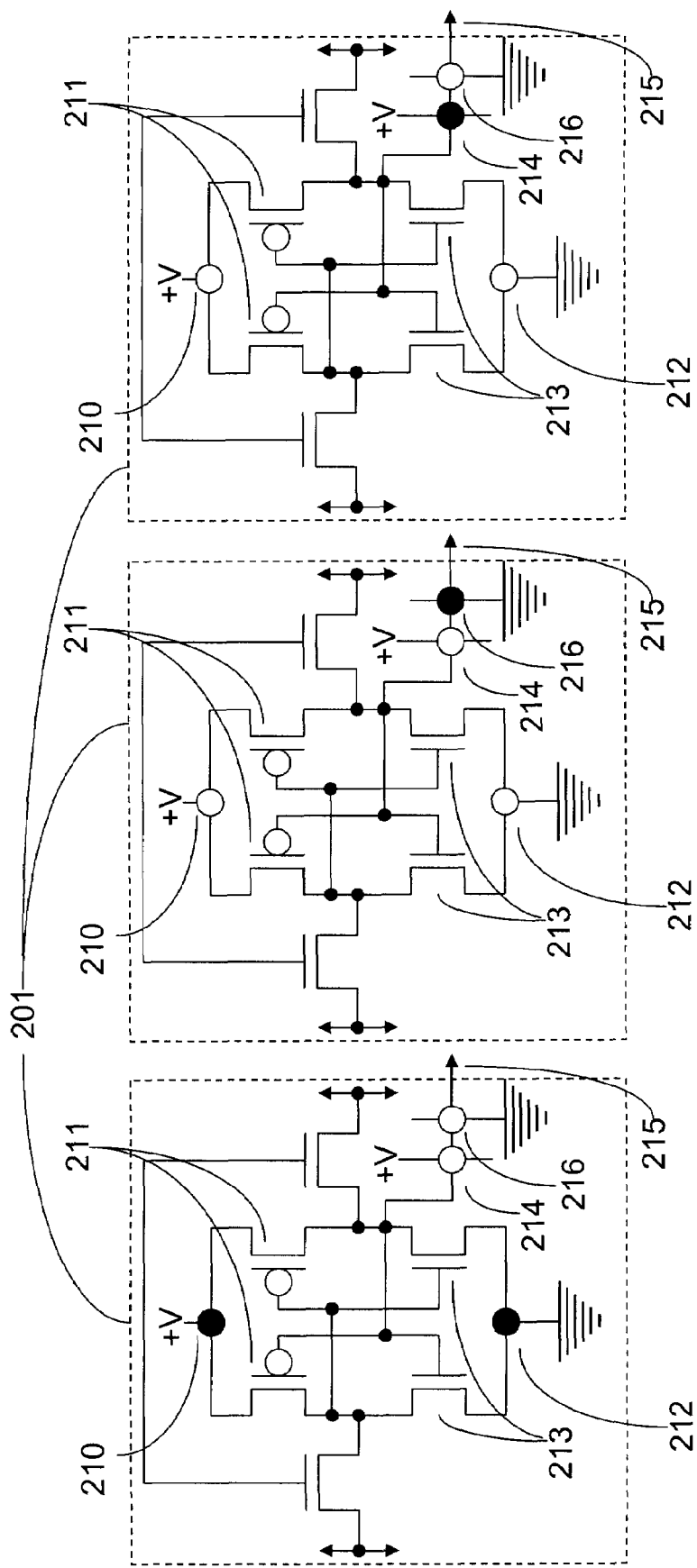
FIG. 21, consisting of FIGS. 21a, 21b, and 21c, illustrates via configurations for a memory cell of a three-input LUT.

Reference is now made to FIG. 21. In another embodiment of the invention, each memory element 201 of the LUT may be configured to either hold an externally programmable memory element as in FIG. 21a, drive a constant zero level as in FIG. 21b, or drive a constant one level as in FIG. 21c. Each memory element 201 of the LUT contains four via locations: one 210 for connecting the p-channel transistors 211 to +V power; one 212 for connecting the n-channel transistors 213 to ground; one 214 for connecting the output 215 to +V; and one 216 connecting the output 215 to ground. In FIG. 21a, the p-channel transistors 211 and n-channel transistors 213 are connected to +V and ground, respectively, by placing two vias in the appropriate locations 210 and 212. In this case the memory element operates as a programmable memory element. In FIGS. 21b and 21c, these two locations 210 and 212 do not have vias, which disconnects the transistors, allowing them to float. In FIG. 21b, the via location 216 connects the output 215 to ground, and in FIG. 21c, the via location 214 connects the output 215 to +V, to permanently configure the LUT. Typically, these via locations all reside on one via layer that is below the via layer used to customize the logic cell. After the chip is customized and manufactured, if the via locations 210 and 212 are filled, which allow memory elements 201 to be programmable, the LUTs may be repeatedly externally programmed to perform any logic function. Alternatively, the LUTs may be customized to perform a specific logic function by filling either via location 214 or 216 to correspond to what would have been the programmed value of the corresponding memory element 201. When configuring all LUTs in all logic cells in this manner, the logic function of the chip need not be loaded into the chip.

Figure 22:
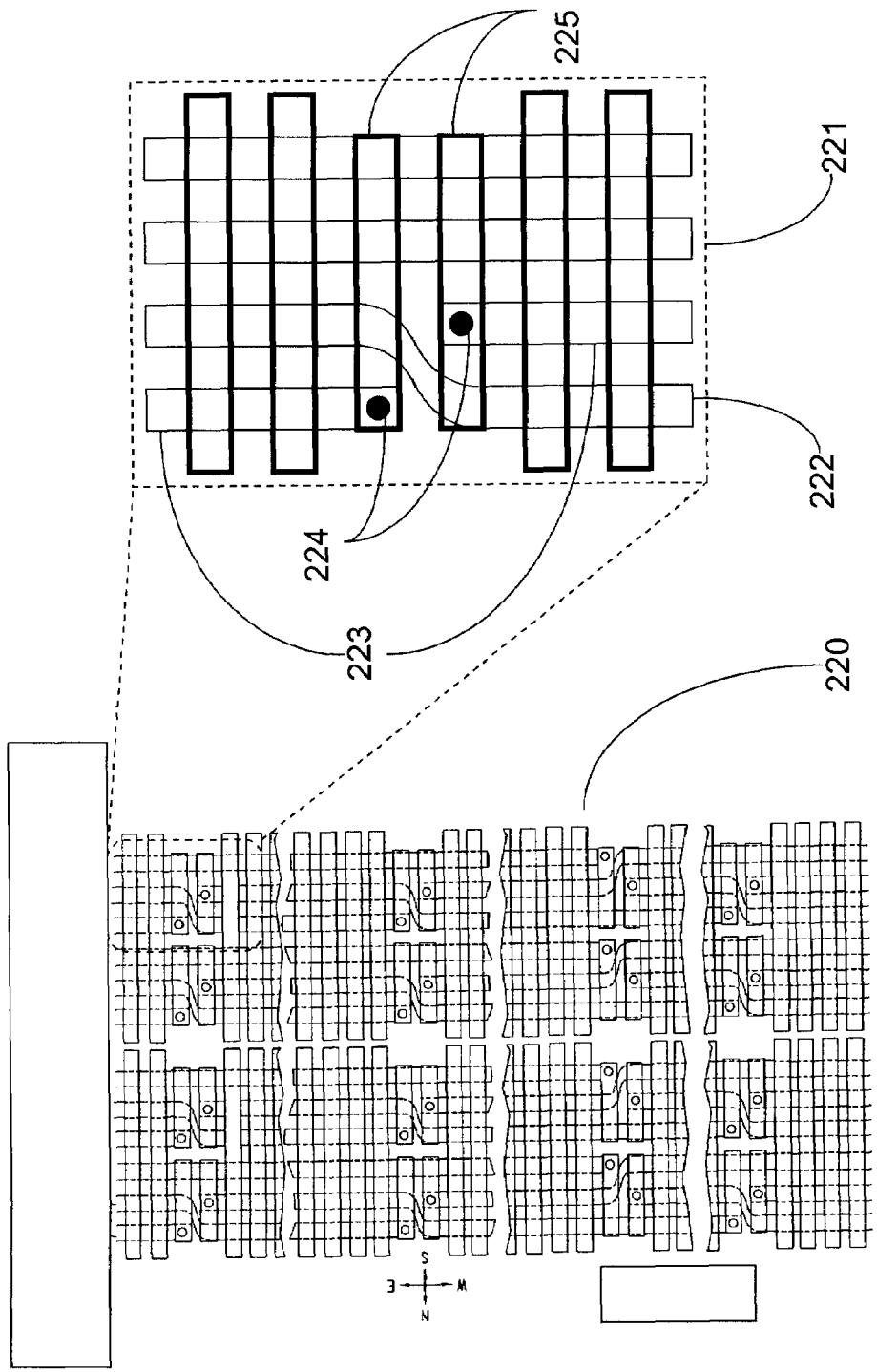
FIG. 22 is a prior art example of long segment interconnection.

Reference is now made to FIG. 22, a prior art example of the first two layers of fixed segments, as seen in FIG. 19 of Or-Bach's U.S. Pat. No. 6,756,811, granted Jun. 29, 2004. This prior art describes four fixed segment layers. Two bottom layers contain respectively, horizontal and vertical long metal segments, and two top layers contain horizontal and vertical short metal segments, used in the customization of the interconnect by selectively adding vias between the top two short metal segment layers. This prior art diagram refers to the two long metal segment layers. For clarity, a repeating portion 221 of the larger prior art diagram 220 has been expanded. When two signal interconnects are adjacent to each other for long distances on an Integrated Circuit, their electrical transitions cause noise on the adjacent interconnect, called crosstalk. The curved line 222 shifts position to avoid such crosstalk from occurring by shifting tracks. The adjacent segments 223 end with fixed vias 224 connecting to horizontal segments 225 on the layer above, for subsequent connection using customizable vias to the short segments. While this provides a mechanism for connecting to long segments, it has the disadvantage of being both difficult to apply, given the lithographic restrictions of high density masks, and not adequately solving the crosstalk problem, since selection of these long segments for interconnect can repeatedly bring two signals next to each other when using adjacent segments.

Reference is now made to FIG. 23, which shows an embodiment of the present invention. FIG. 23a shows the two lower layers of long horizontal and vertical segments. A repeating pattern of long horizontal and vertical segments, where at each location such as shown in the diagram, one of the horizontal and vertical segments ends. In FIG. 23a there are two ends to two long horizontal segments 230, and two vias 231 connecting the segments to two vertical segments 232 on the layer above, which are in turn connected to two short horizontal segments 233 by two other fixed vias 234. From site to site a different long segment may end, with corresponding vias 231, but on every site there are short vertical segments 232, horizontal segments 233, and their associated vias 234. FIG. 23b shows the rest of the top two short segment layers. Here two short vertical segments 235 are connected to the short horizontal segments 233 with customizable vias 236. This allows each long segment 230 to be further connected to one of the short segments horizontal segments 237. Similarly, as shown in FIG. 23a, the long vertical segments that end at this site 238 are connected to short horizontal segments, which in turn allows them to be connected to short vertical segments 240 with customizable vias.

Figure 24:
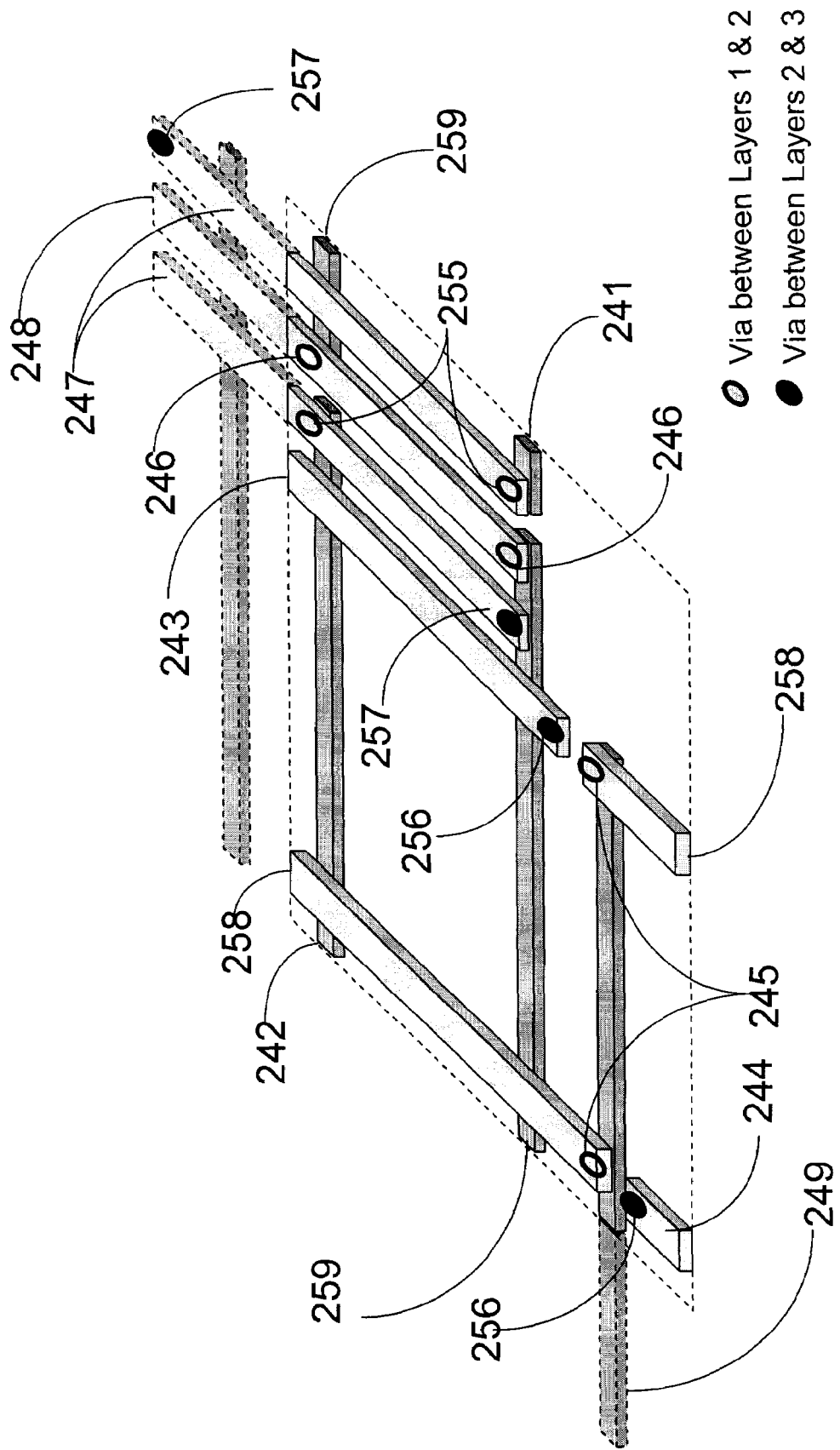
FIG. 24 is an illustration of fixed connections between the bottom two layers of four layers of interconnect.

Reference is now made to FIG. 24, a pictorial example of the lower two long segment layers where segments are connected with predefined vias. Long horizontal segments 241 and 242 are connected to vertical jumpers 247 with preexisting fixed vias 255, and are in turn connected to the third layer segments with preexisting fixed vias 257 such that the segments 241 and 242 may either be connected together or be connected to short segments on the top two metal layers by customized vias. Similarly, segments 243 and 244 are connected to the top two customizable layers with preexisting fixed vias 256 such that they may be connected to each other or connected to short segments on the top two metal layers. In between the ends of segments 241 and 242, there also exist a jumper segment 248 and preexisting fixed vias 246, which connect the segments 259 together. Similarly, between the ends of the segments 243 and 244 is a jumper segment 249, which, with preexisting fixed vias 245, connects the segments 258 together. In this fashion, long segments on the bottom two metal layers, comprised of these segments and jumpers, may periodically change from one track to another. Again, while the specific pair of tracks 259 and 258 may differ from one site to another, along with the vias 246 and 245, the same connecting jumper is available at each site to keep the long lines from being adjacent to each other for more than a few sites.

As such, in yet another preferred embodiment of the invention, customizable long segment interconnects may be periodically connected with fixed jumpers to change tracks, thus minimizing potential cross-talk with other adjacent long segment interconnects.

Figure 25:
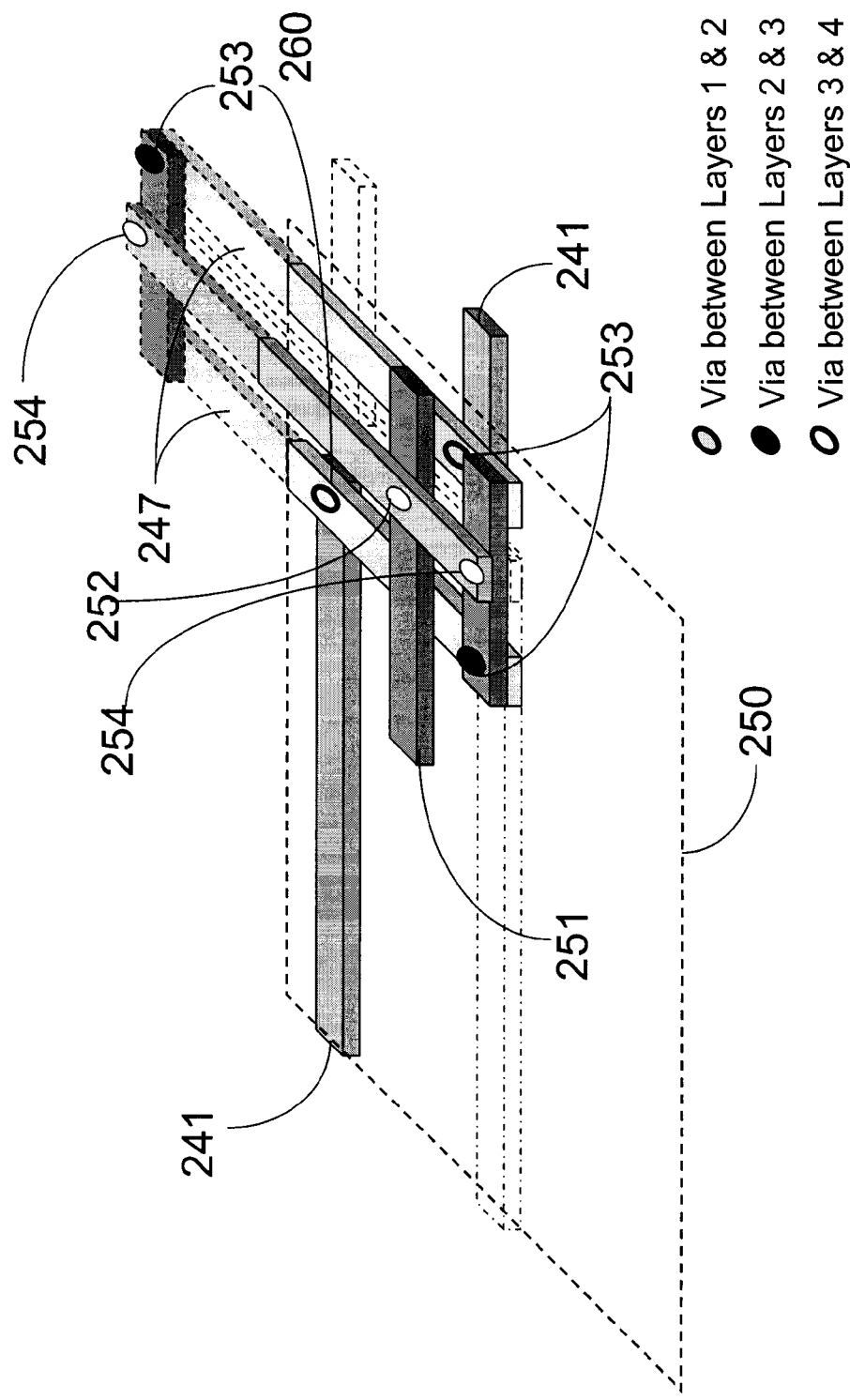
FIG. 25 is an illustration of connecting segments on the fourth layer together.

Reference is now made to FIG. 25, which is a pictorial example of specifically interconnected segments from the first and second interconnect layers. The tiled region 250 shown in FIGS. 24 and 25 repeats, where the segments that extend beyond the region connect to the segments within the region by abutment, and in this example segments 247 and 241 are equivalent between the two figures. When via locations 254 are filled, the two long horizontal segments 241 are connected together through a series of jumpers on layers two and three connected by pre-existing fixed vias 253. Finally, when via location 252 is filled the short horizontal segment 251 is connected to the split long horizontal segments 241.

Figure 26:
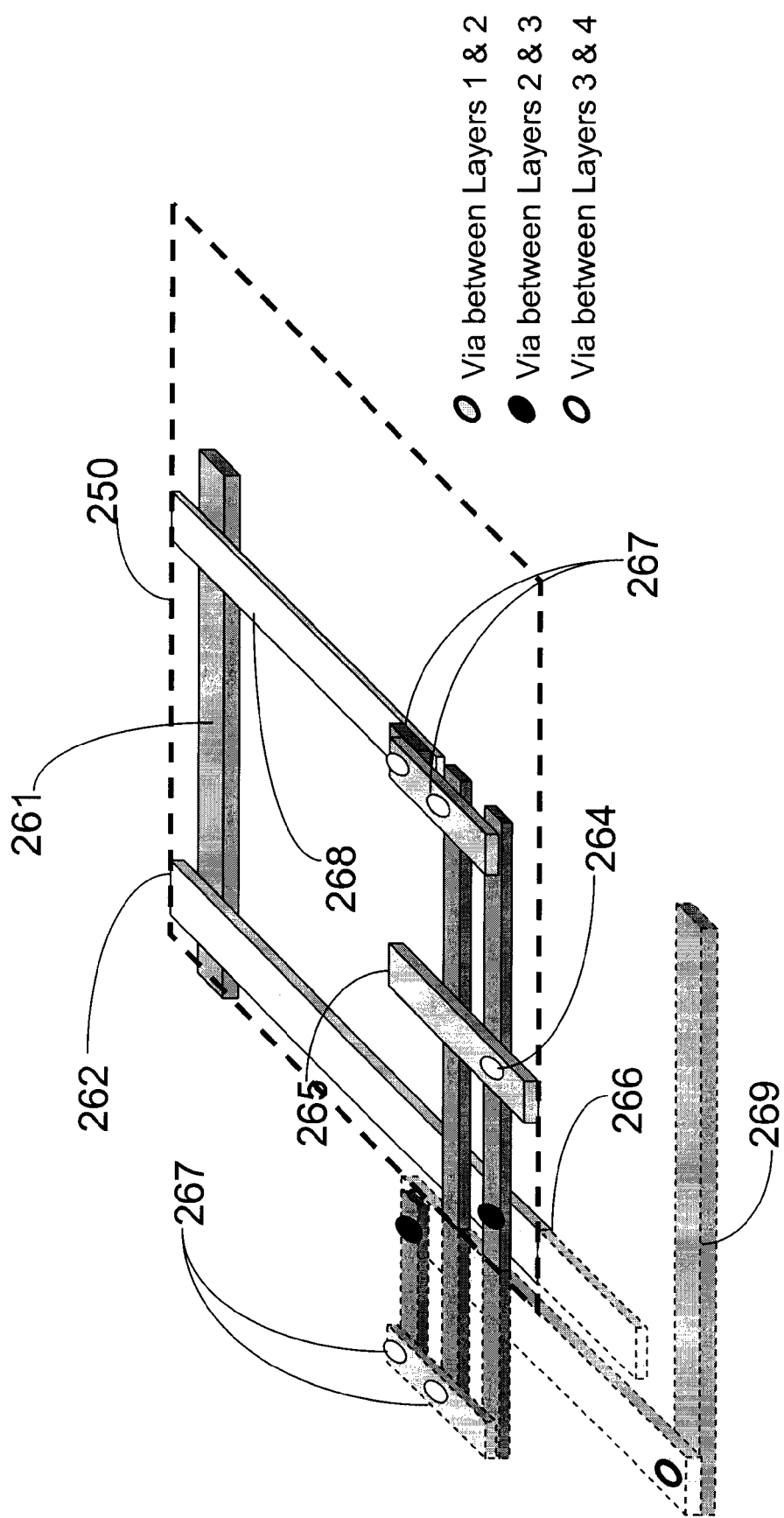
FIG. 26 is an illustration of connecting segments on the third layer together.

Reference is now made to FIG. 26. When via location 264 is filled, the long vertical segment 266 on the second layer is connected to a short vertical segment 265 on the fourth layer. Also when via locations 267 are filled, the long horizontal segment 269 in the region adjacent to region 250 is connected to the long vertical segment 268 by connecting jumpers on layer one to the existing jumpers on layers two and three that are connected by preexisting fixed vias.

Figure 27:
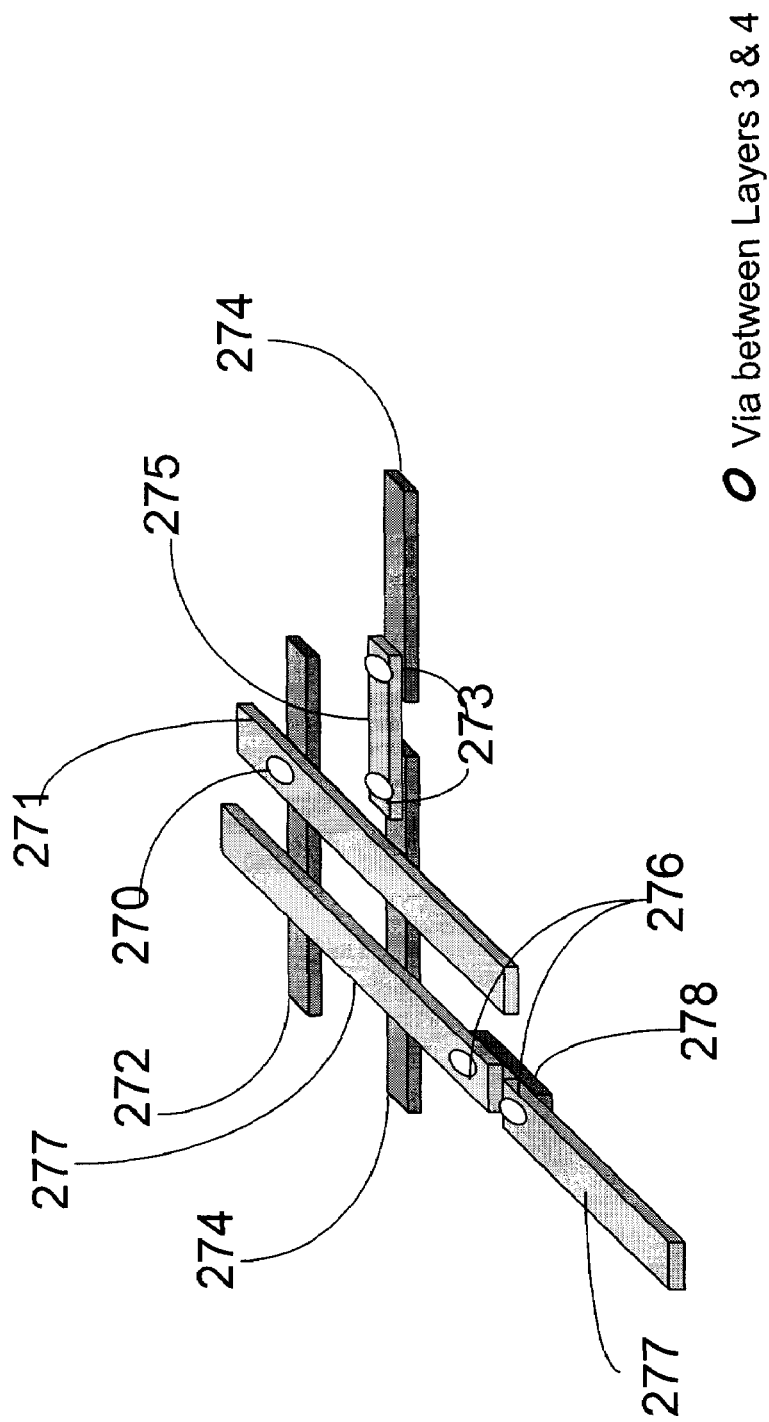
FIG. 27 is an illustration of connections between segments on the top two layers.

Reference is now made to FIG. 27, which is a pictorial example of specifically interconnected segments from the third and fourth interconnect layers shown in FIG. 22. When the via location 270 is filled it connects the short horizontal segment 272 with the short vertical segment 271. Similarly, when via locations 273 are filled the jumper 275 connects two short horizontal segments 274, and when via locations 276 are filled the jumper 278 connects two vertical segments 277.

Figure 28:
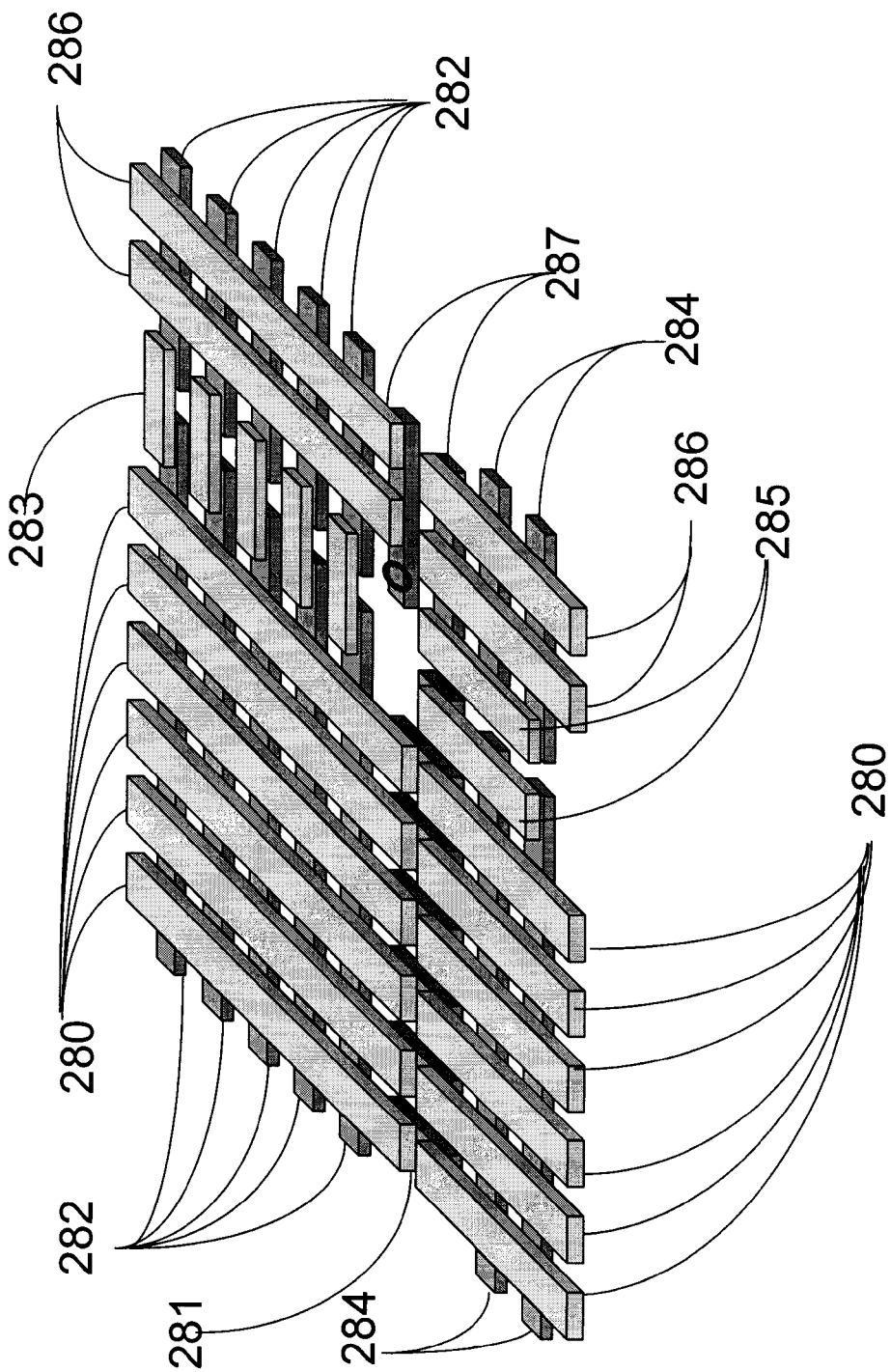
FIG. 28 is an illustration of the top two fixed segment layers.

Reference is now made to FIG. 28, which shows an embodiment of the third and fourth interconnect layers of the present invention. The fourth layer contains short vertical segments 280 connected together with jumpers 281 on the third layer, and jumpers 283, which connect short horizontal segments 282 also residing on the third layer. The third layer also contains long horizontal jumpers 284 connected to the ends of two long vertical segments on the second layer and short horizontal jumpers 287 connected to jumpers on the second layer.

Figure 29:
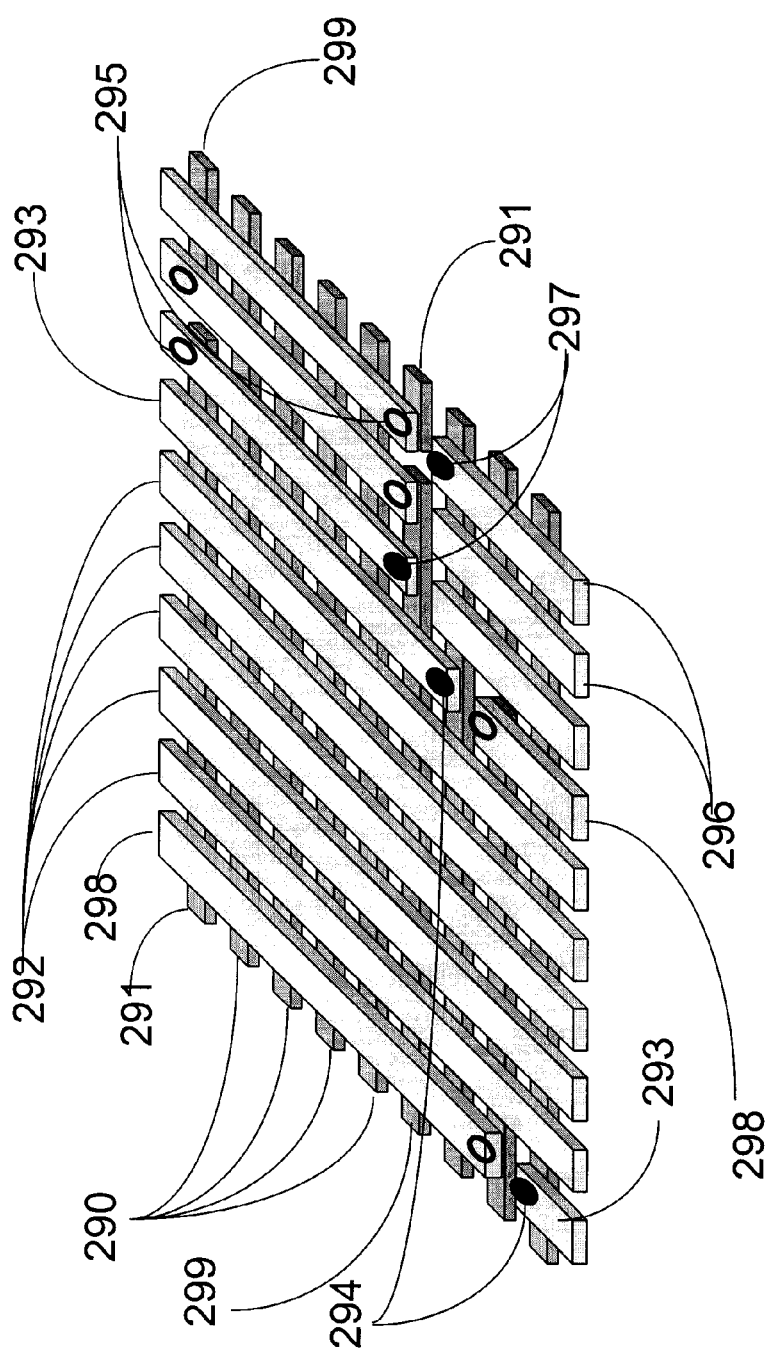
FIG. 29 is an illustration of the bottom two fixed segment layers.

Reference is now made to FIG. 29, which is a pictorial example of the first and second interconnect layers. The first layer contains: long horizontal segments 290 that continue through the region; one pair of segments 299 that are connected with a vertical jumper to periodically change track locations; and one pair of segments 291 that are each connected through vias 295 to vertical jumper segments on layer two, which are in-turn connected through other vias 297 to layer three. In this way, segments 291 may either be connected to each other, or each to short segments on layers three and four, by selecting the proper customizable vias. Similarly, the second layer contains: long vertical segments 292 that continue through the cell location; one pair of segments 298 that are connected with a horizontal jumper to periodically change track locations; and one pair of segments 293 that are each connected through vias 294 to layer three. In this fashion, segments 293 may be connected to each other or to short segments on layers three and four by the proper selection of customized vias.

Figure 30:
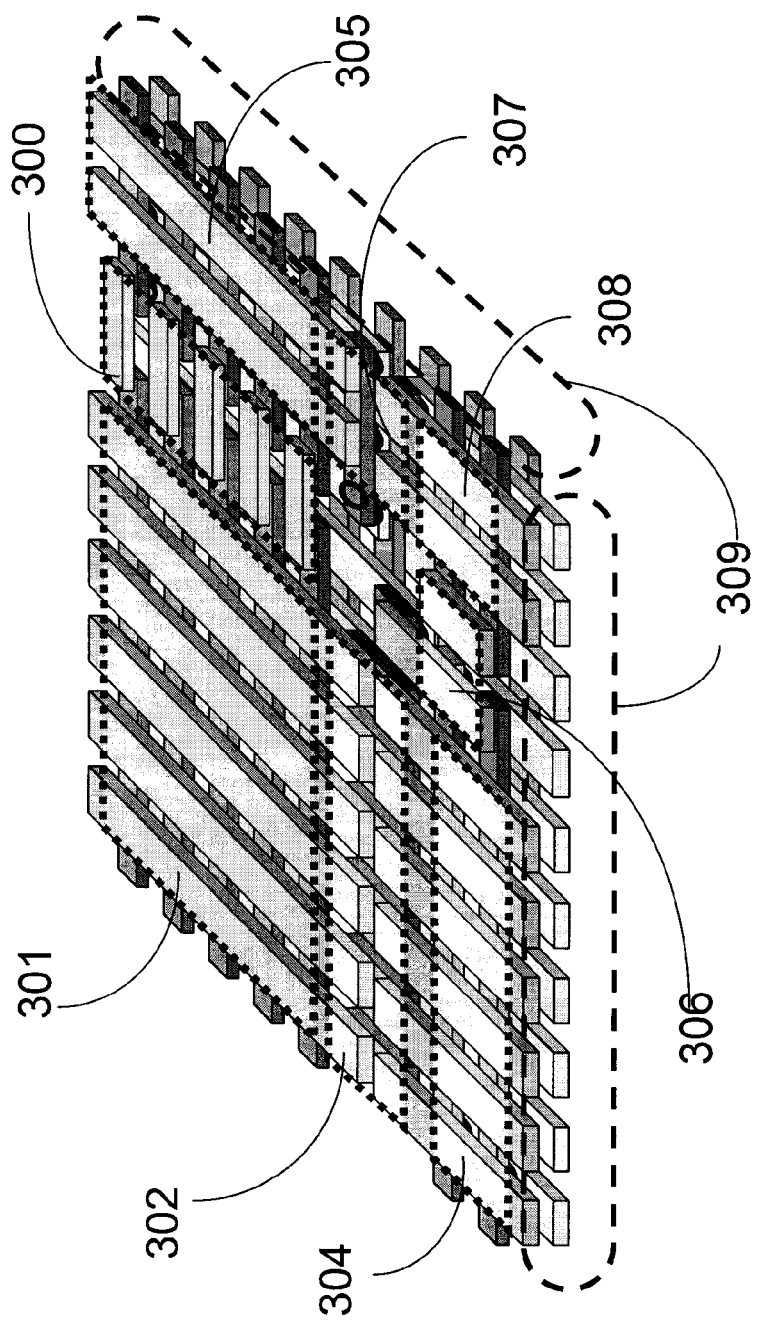
FIG. 30 is an illustration of four metal layers of the physical customized interconnection structure for connecting the programmable logic cells together.

Reference is now made to FIG. 30, which is a pictorial example of a repeating portion of the four interconnect layers of an exemplary embodiment of the invention. The ends 309 of selected segments on all four layers preferably connect by abutment to corresponding segments on adjacent repeating portions of the interconnect layers. All customizable connections are made by filling via locations between intersecting segments on the third and fourth layers.

Within each repeating group of segments there are: via locations 300 for connecting short horizontal segments together on layer 4 with jumpers on layer 3; via locations 302 for connecting short vertical segments together on layer 3 with jumpers on layer 4; via locations 301 for connecting short horizontal segments on layer 3 to short vertical segments on layer 4; via locations 305 for connecting long horizontal segments on layer 1 through jumpers and fixed vias to short horizontal segments on layer 3; via locations 304 for connecting long vertical segments on layer 2 through fixed vias and jumpers to short vertical segments on layer 4; via locations 307 for connecting long horizontal segments together; via locations 306 for connecting long vertical segments together; and via locations 308 for connecting long vertical segments to long horizontal segments, where all such via locations reside between interconnect layers three and four.

As such, in yet another preferred embodiment of the invention, customizable interconnects in conjunction with fixed jumpers and vias allow the direct connection between any pair of segments on all four layers.

Figure 31:
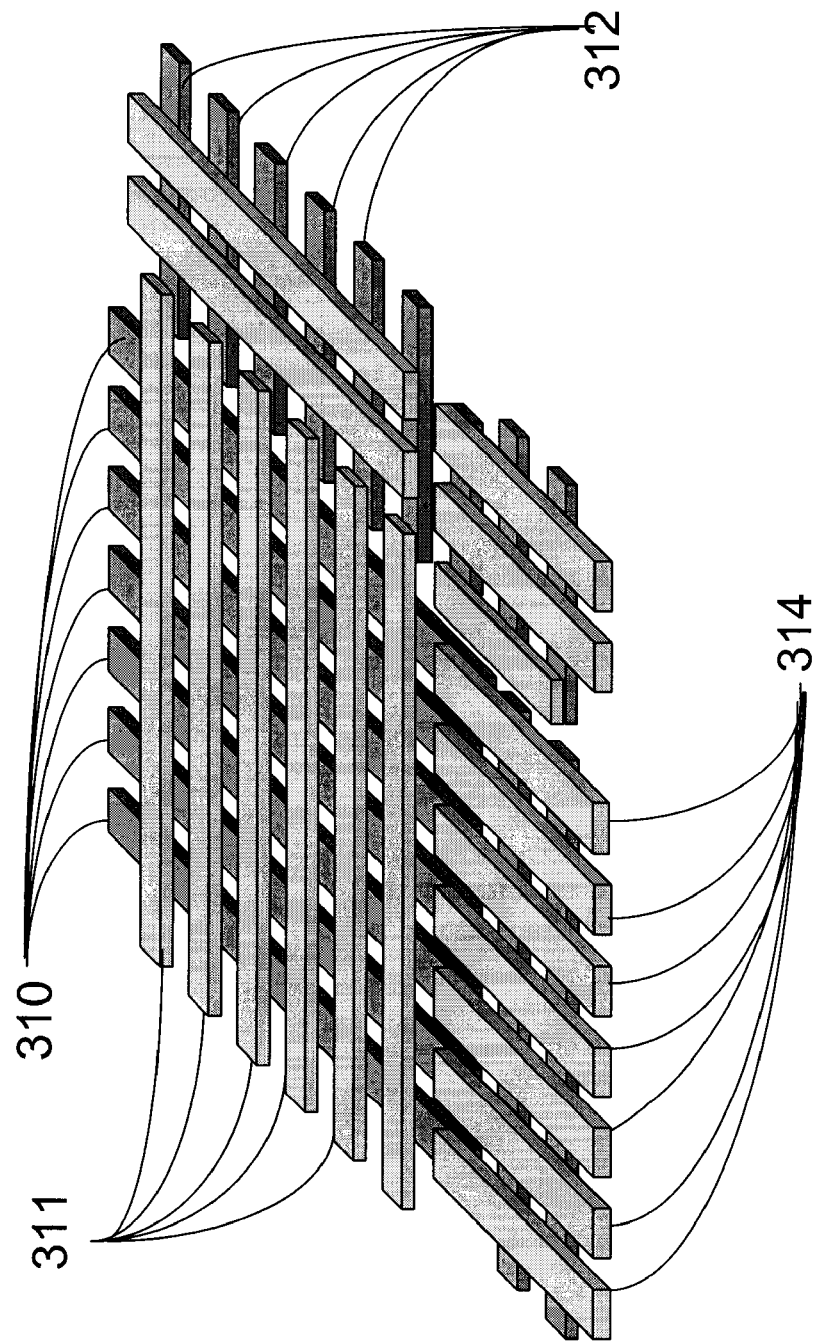
FIG. 31 is another illustration of two metal layers of the physical customized interconnection structure for connecting the programmable logic cells together.

Reference is now made to FIG. 31, which is an illustration of another way to structure the customizable top two metal layers. In yet another embodiment of the invention, the segments below the customizable via layer may be arranged such that all preexisting fixed vias connecting to the cell I/Os and fixed vias connecting to the lower level wiring tracks connect to segments that can be extended with jumpers. The jumpers 312 or short vertical segments 310 reside on the lower level, and may be extended by connecting them with customizable vias, respectively, to the horizontal segments 311 or the jumpers 314 on the upper layer. The jumpers 314 and 312 allow the lower level long segments to be connected to the upper level short segments in either direction.

Figure 45:
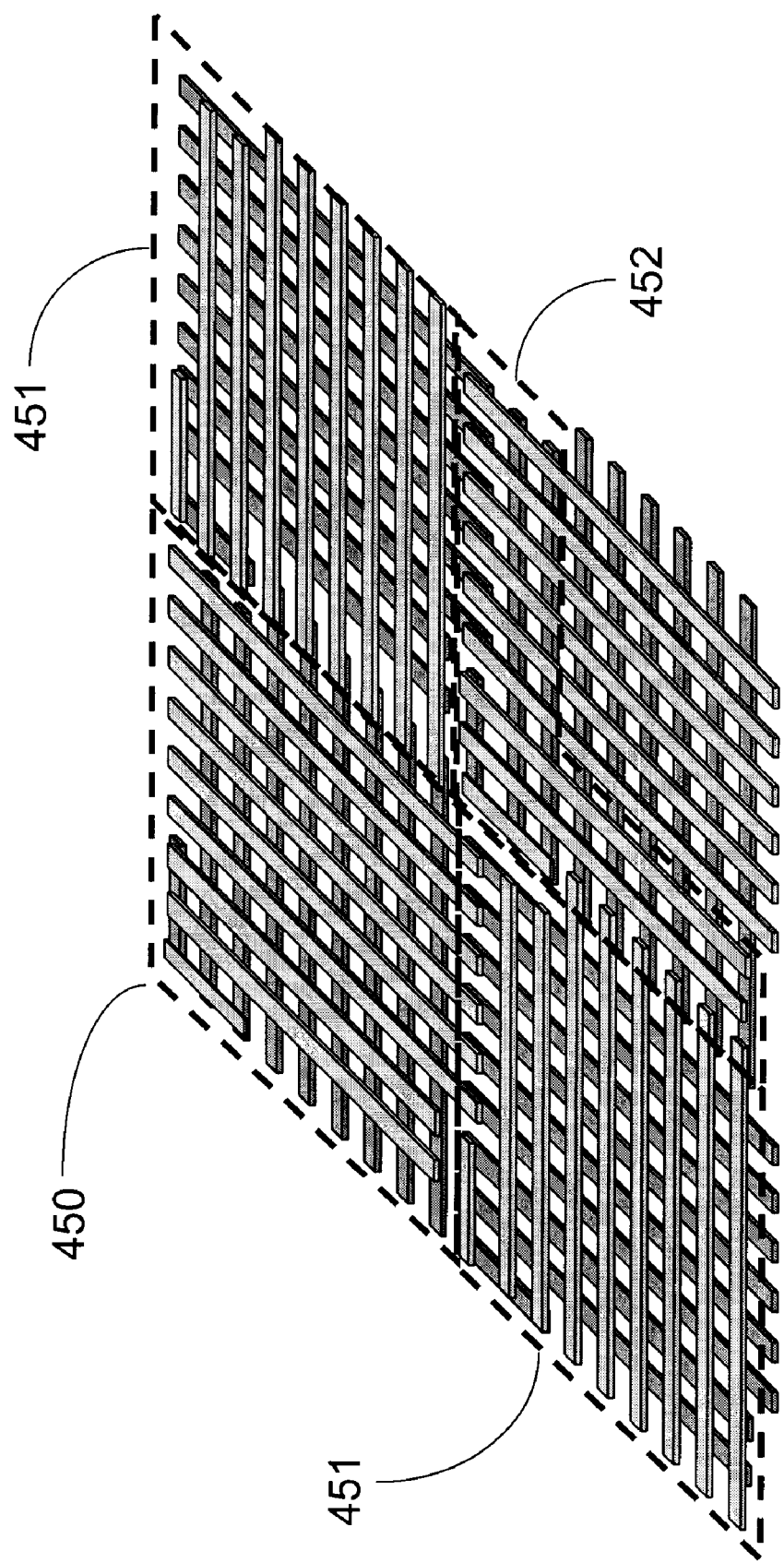
FIG. 45 is another illustration of the top two metal segment layers.
Figure 46:
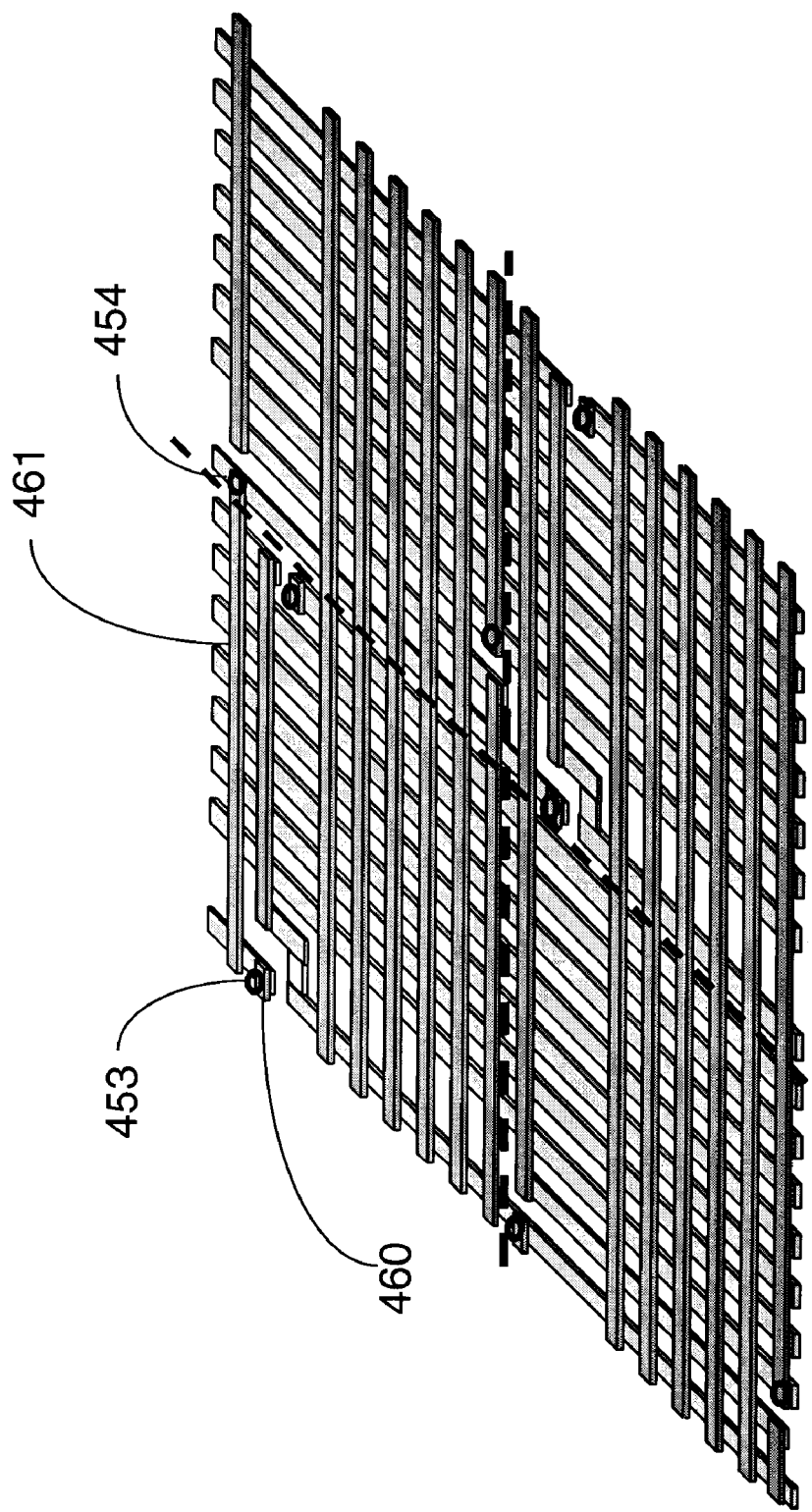
FIG. 46 is another illustration of the bottom two fixed metal segment layers.

Reference is now made to FIG. 45, another illustration of yet another way to structure the fixed segments of the top two metal layers. In this embodiment of the invention, any short routing segment may be connected to its adjacent short routing segments using a single customizable via. For segments that are connected end to end, this may be accomplished by alternating the direction of the segments on each layer from a first type of tiled region, such as 450, to its adjacent second type of tiled region 451, thus replacing the pair of vias and jumpers 281 and 283, as seen in FIG. 28, with a single via between segments, which may be created at a border between tiled regions (e.g., 450 and 451). Structures 452 similar to 284, 285, 286 and 287, shown in FIG. 28, consisting of long and short jumpers may be used to connect to the bottom two fixed metal segment layers. In each tile, permanent fixed vias 453 and 454 connect the perpendicular metal segments 455 and 456 respectively to the upper layer fixed metal segments 460 and 461 on the bottom two fixed metal segments shown in FIG. 46, allowing any segments on the top two metal layers to be customizably connected to one or more segments on the bottom two metal layers.

Reference is again made to FIG. 12, which depicts a block of logic cells with address logic 121 and buffer logic 122 about the periphery of the block.

Figure 32:
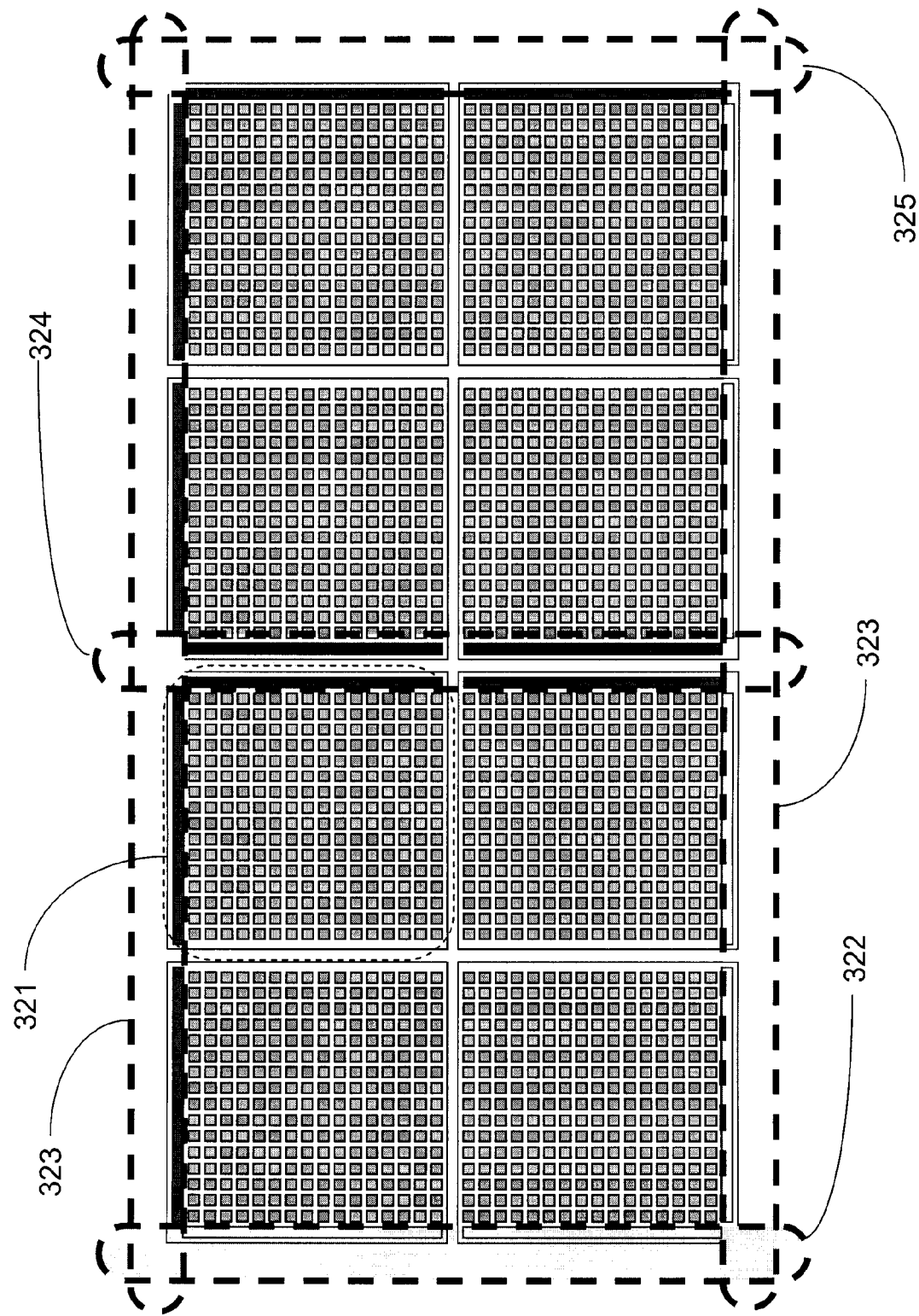
FIG. 32 is an illustration of a large region of programmable logic cells depicting the locations of additional layers of long segments.

Reference is now made to FIG. 32, a diagram of eight such blocks 321, which contains, above the blocks' address logic, a space 322 to place wiring for the optional connection to horizontal long wires, and above the blocks' buffer logic, a space 323 to place wiring for the optional connection to vertical long wires, preferably on interconnect layers 5 and 6 respectively.

Figure 33:
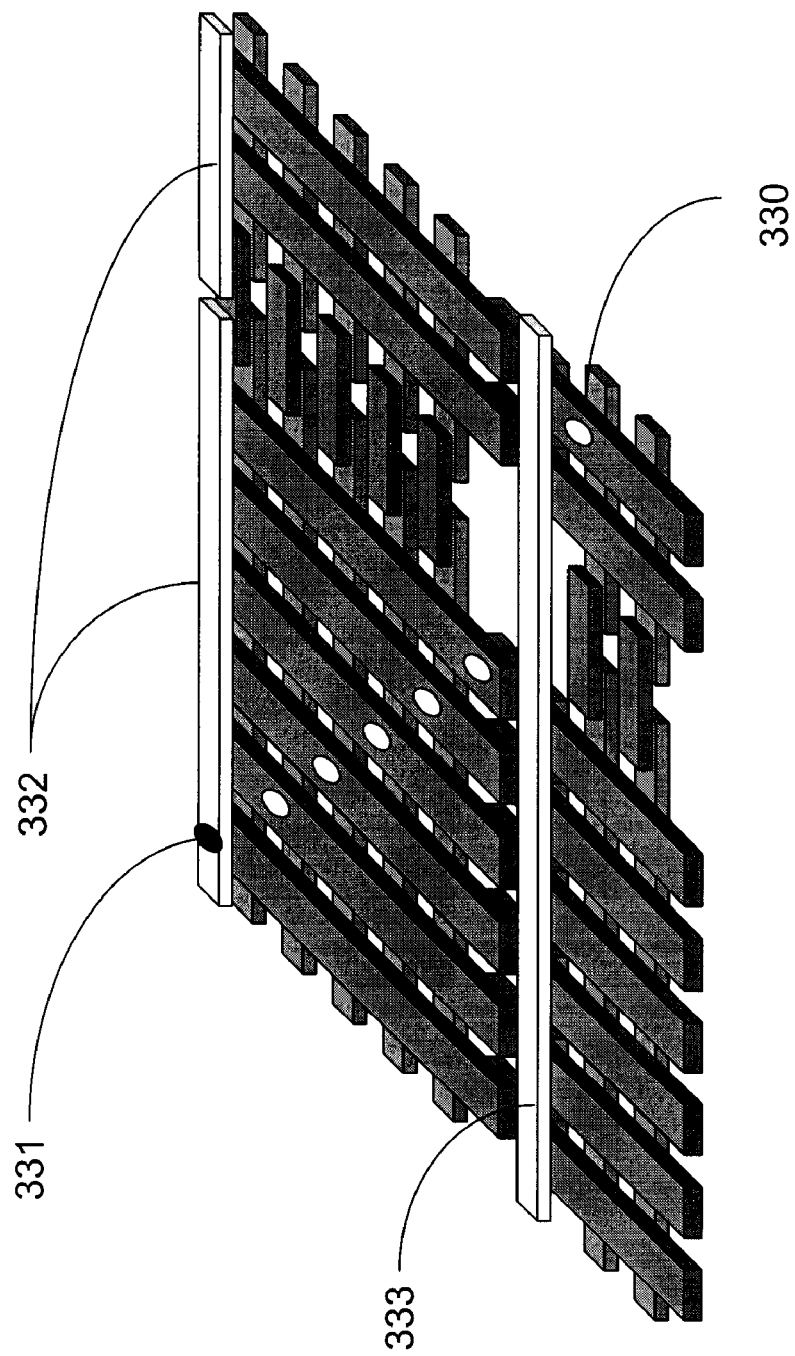
FIG. 33 is an illustration of long segment connections.

Reference is now made to FIG. 33, which is a diagram of one way to interconnect layers 3 and 4 to the horizontal long lines on layer 5 as depicted by wires 332, and via 331 between layer 5 and layer 4. Every horizontal long line (not all depicted here) is connected to a layer 4 vertical line with a via 330. The horizontal long lines extend from one connection space 322 to the next connection space 324 as shown in FIG. 32, across at least two blocks 321. Some horizontal long lines, such as 333 shown in FIG. 33, extend from one connection space 322 in FIG. 32, beyond the next connection space 324, to the next connection space 325.

Figure 34:
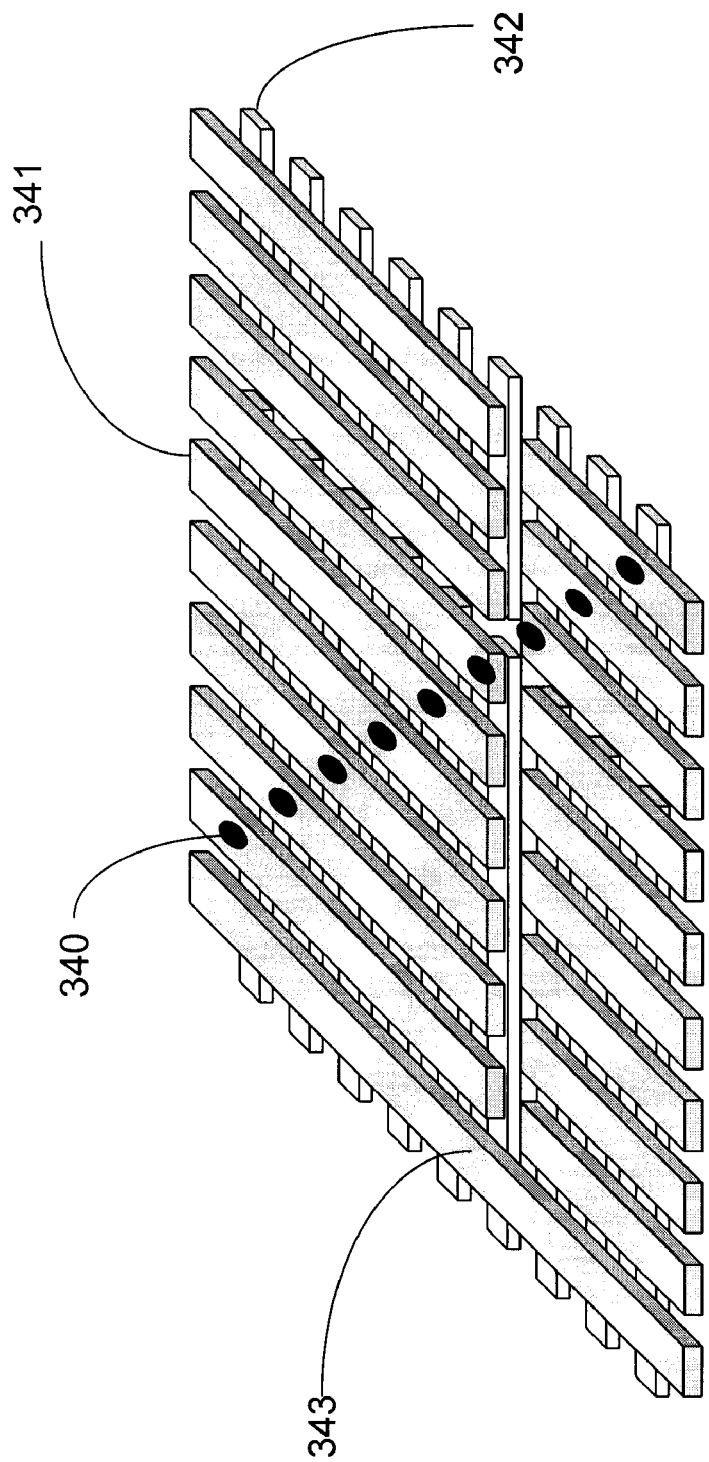
FIG. 34 is another illustration of long segment connections.

Reference is now made to FIG. 34, which is a diagram depicting one way to interconnect layer 4 segments and the segments 342 on layer 5 to the vertical long lines 341 on layer 6. Here, the fixed vias 340 connect between the vertical long lines 341 and short horizontal segments 342, which in turn connect to layers 3 and 4 in the manner shown in FIG. 32. Some vertical long lines 343 extend beyond the next connection space 323, as shown in FIG. 32.

In yet another preferred embodiment of the invention, interconnect layers 5 and 6 may be optionally added as necessary to wafers where one or more chips require additional long lines for routing the added interconnections. Furthermore, the layout system may optionally route these interconnections both on four or six layers of routing, selecting the option, preferably with the lowest number of layers, that meets the interconnect requirements of the design. In addition, such chips, with six layers of routing may be collected on wafers 160, such as depicted in FIG. 16, to more efficiently process designs that require six layers of interconnect routing.

In yet another embodiment of the invention, the logic array 11 in FIG. 1 is comprised of groups of logic cells. The same decode logic, as shown in FIG. 12 that is used to program the logic cells, when properly customized, may also be used as the decodes for a customized RAM.

Figure 35:
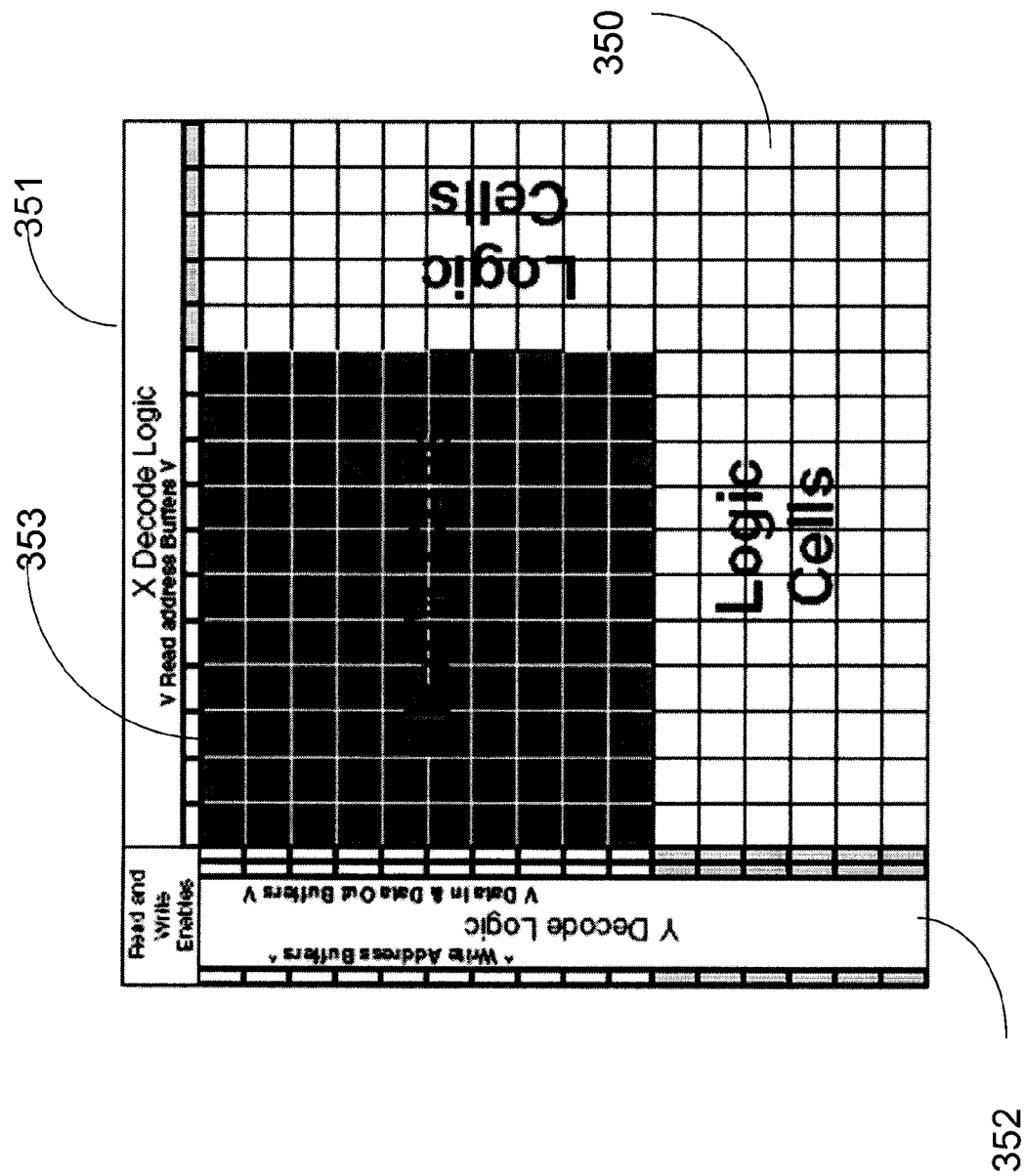
FIG. 35 is another illustration of a multiplicity of logic cells with embedded decode logic for configuring the logic cells into a memory.

Reference is now made to FIG. 35, a group of logic cells with customized RAM. Each group of 256 logic cells 350 also contains Xdecode logic 351 and Ydecode logic 352, which may be customized to use any number of the logic cells as RAM cells 353. Any rectangular arrangement of cells within such groups may be configured along with the custom decode logic and some customized interconnect into a RAM.

Figure 36:
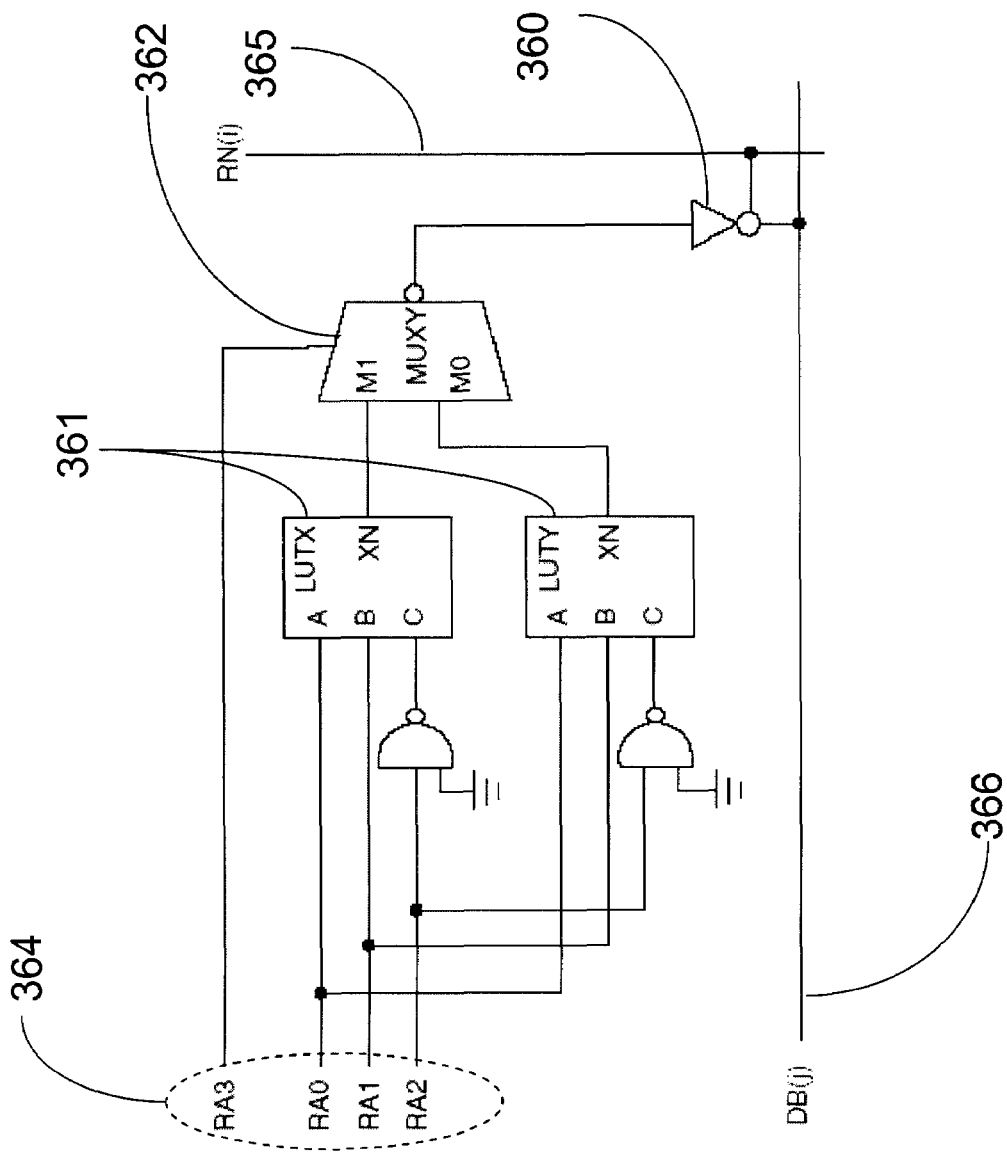
FIG. 36 is an illustration of a logic cell customized for use as a 16 bit RAM cell in a logic cell based memory.

Reference is now made to FIG. 36, a specific customization of a logic cell. When the logic cells in a group are each customized as 16 bits of RAM, four address lines 364 select one bit value out of the two LUTs 361 contained within each of the logic cells. The output of the multiplexer 362 within the logic cell each drives a tristate inverter 360, which is controlled by a decoded row signal 365 that, when enabled, drives the bit value onto a bit line 366.

To form such a RAM, or multiple copies of such a RAM connected into one memory, the designer may use a special tool, which connects the primary memories with additional logic cells. The dedicated decode logic coupled with priority wire interconnect creates flexible user-definable memories, with performance near that of standard cell memories.

In yet another embodiment of the invention, any unused block of logic cells may be customized to conserve leakage power. Reference is again made to FIG. 32. The regions 322, 323, 324, and 325 also contain power and ground interconnects for the blocks such as 321. Normal customization would connect each block's power lines to the power interconnect and each block's ground lines to the ground interconnect in the regions 322, 323, 324 and 325 closest to the block, but if the block is unused, the block's power lines may preferably be connected to the ground interconnect in the regions, to eliminate the leakage power consumed by the unused logic. All outputs, such as the clock returns 383 in FIG. 38 or other built-in outputs, may either be disconnected or tied off to ensure correct operation of the rest of the chip.

In yet another embodiment of the invention, multiple die of different sizes with solder bump I/O may be scribed and diced in such a way that they may be interchangeably packaged in one or a few packages. Additional solder bumps may be added to the unused space to ensure the proper flow of a filler, such as epoxy, during package assembly.

Figure 42:
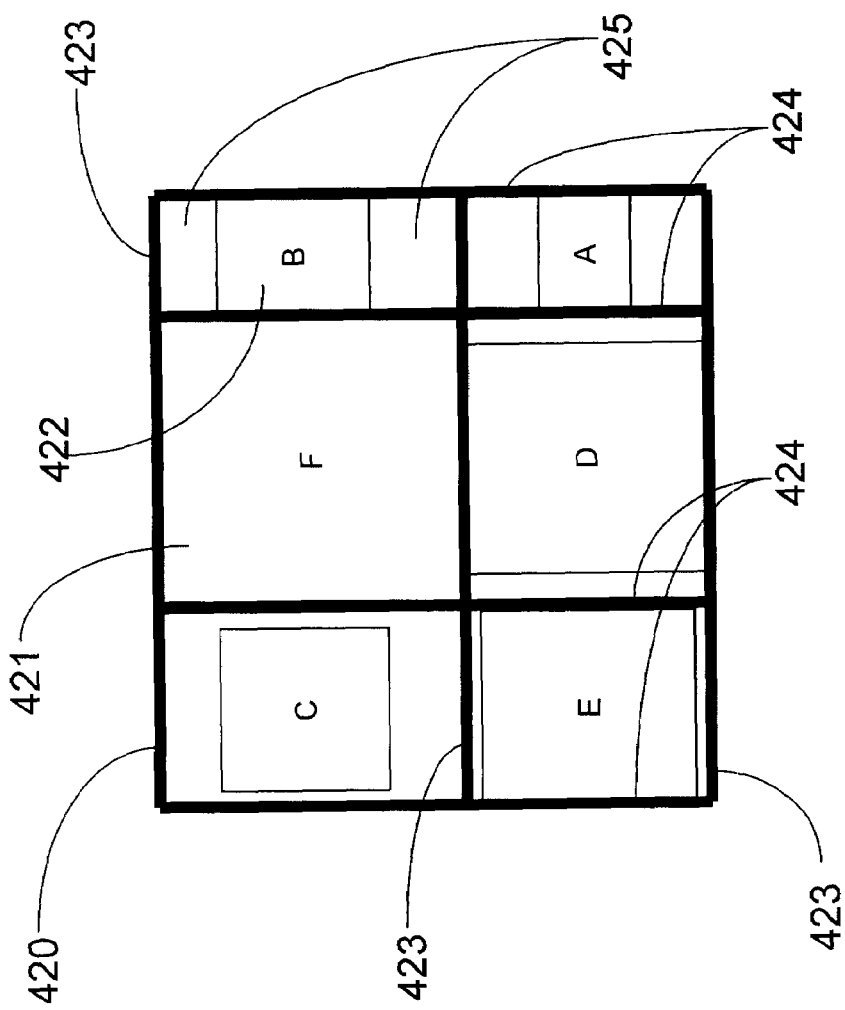
FIG. 42 is another diagram of a reticle.

Reference is now made to FIG. 42, a diagram of a reticle 420 containing dies of different sizes. In this case, traditional scribe and break methods may be employed since the horizontal scribe lines 423 and vertical scribe lines 424 extend across the whole wafer, the locations of the scribe lines being determined in each dimension by the largest die 421 in each row and column. Smaller die 422 in any given row or column of the wafer contain unused space 425 determined by the locations of the scribe lines.

Figure 43:
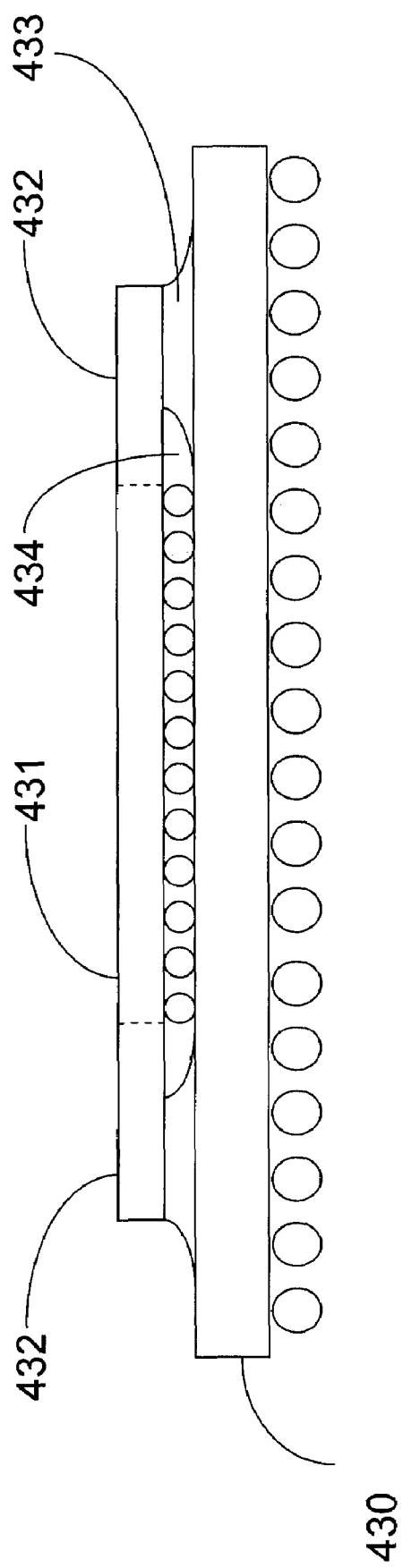
FIG. 43 is a side view of a solder bumped die on a ball grid package.

Reference is now made to FIG. 43, a side view of a solder bumped die on a ball grid package. A die may be assembled on a ball grid package 430 of sufficient size. This is desirable when prototyping since fewer packages need to be qualified for the initial design. Unfortunately, a die 431 with unused space 432 on the ends of the die may cause the filler 433 between the die and the package to insufficiently flow, which may cause air pockets 434 to form around the solder bumps, which can cause package reliability problems.

Figure 44:
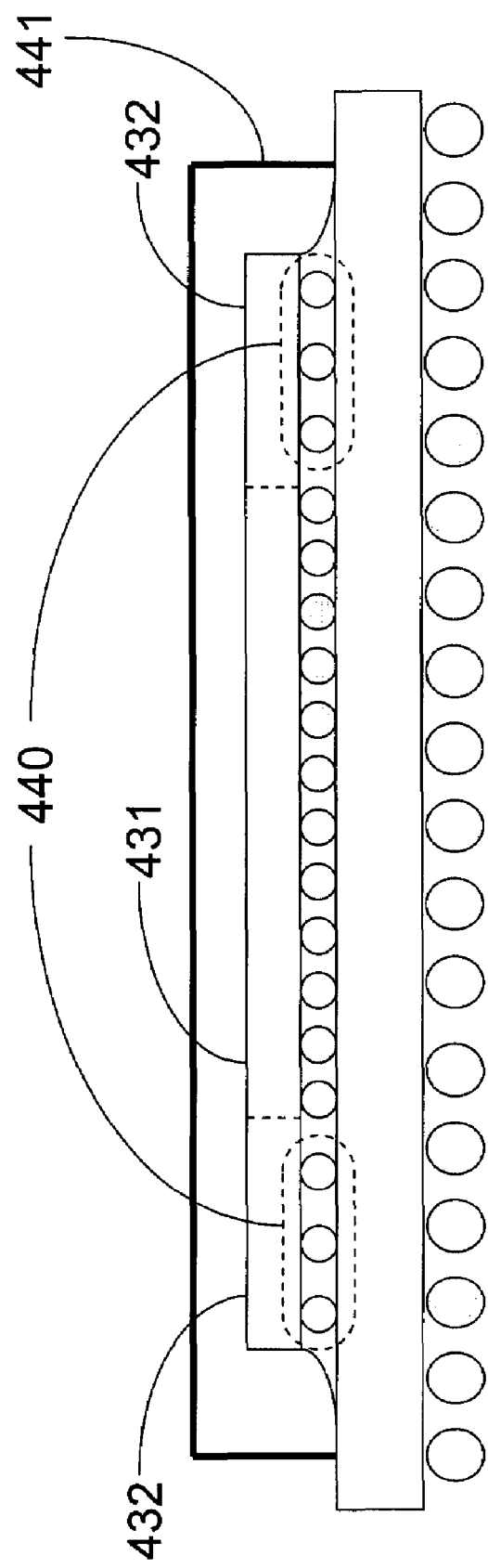
FIG. 44 is another side view of a solder bumped die on a ball grid package.

Reference is now made to FIG. 44, another side view of a solder bumped die on a ball grid package. To remedy the above-described problem, dummy solder bumps 440 may be added to the unused space 432 around the die 431. The wicking action caused by the presence of the dummy solder bumps may then ensure the proper flow of the filler. Of course, for high volume designs, the unused space 432 may be removed by an additional scribe and break process, allowing the smaller die to be optionally packaged in a smaller package. Such a technique may be applied to any package and packaging process that can accommodate a solder bumped die. Some of these packaging processes include additional steps following the filler seal, such as adding a cover cap 441, or lid to seal the cavity containing the die.

It will be appreciated by persons skilled in the art that the present invention is not limited by what has been particularly shown and described hereinabove. Rather the scope of the present invention includes both combinations and sub-combinations of various features described hereinabove as well as modifications and variations which would occur to persons skilled in the art upon reading the foregoing description and which are not in the prior art.

We claim:

1. A method for customizing a clock distribution system within a semiconductor device, said clock distribution system comprising at least one customizable trimmer cell to fine tune said clock distribution system's delay, and at least one customizable phase lock loop circuit, said method comprising:
   configuring phase and frequency of at least one clock by configuring at least one said phase lock loop circuit; and
   customizing delay of said clock distribution system by customizing at least one customizable trimmer cell, said customizing including selecting one or more vias of a custom via layer.

\* \* \* \* \*